United States Patent
Huang et al.

(10) Patent No.: US 10,388,664 B2
(45) Date of Patent: Aug. 20, 2019

(54) INTEGRATED CIRCUIT DEVICE WITH LAYERED TRENCH CONDUCTORS

(71) Applicant: MACRONIX INTERNATIONAL CO., LTD., Hsinchu (TW)

(72) Inventors: Yukai Huang, Taipei (TW); Chun Ling Chiang, Hsinchu (TW); Yung-Tai Hung, Chiayi (TW); Chun Min Cheng, Hsinchu (TW); Tuung Luoh, Taipei (TW); Ling Wuu Yang, Hsinchu (TW); Ta-Hung Yang, Hsinchu (TW); Kuang-Chao Chen, Taipei (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 15/913,190

(22) Filed: Mar. 6, 2018

(65) Prior Publication Data

US 2018/0269225 A1    Sep. 20, 2018

Related U.S. Application Data

(63) Continuation-in-part of application No. 15/462,201, filed on Mar. 17, 2017, now abandoned.

(51) Int. Cl.
*H01L 27/11582* (2017.01)
*H01L 27/1157* (2017.01)
*H01L 23/00* (2006.01)

(52) U.S. Cl.
CPC ...... *H01L 27/11582* (2013.01); *H01L 23/562* (2013.01); *H01L 27/1157* (2013.01)

(58) Field of Classification Search
CPC .......... H01L 27/11582; H01L 27/1157; H01L 23/562
USPC .......................................................... 257/324
See application file for complete search history.

(56) References Cited

U.S. PATENT DOCUMENTS

| | | | |
|---|---|---|---|
| 5,700,726 A | 12/1997 | Huang et al. | |
| 5,905,279 A * | 5/1999 | Nitayama | H01L 27/10861 257/301 |
| 7,229,923 B2 | 6/2007 | Catabay et al. | |
| 8,053,861 B2 | 11/2011 | Mountsier et al. | |
| 8,508,018 B2 | 8/2013 | Akolkar et al. | |
| 9,230,979 B1 * | 1/2016 | Pachamuthu | H01L 27/11575 |
| 9,443,861 B1 | 9/2016 | Pachamuthu et al. | |
| 9,520,485 B2 | 12/2016 | Lue | |
| 9,659,956 B1 * | 5/2017 | Pachamuthu | H01L 27/11575 |

(Continued)

OTHER PUBLICATIONS

EP Extended Search Report in related application EP 18161174.0, dated Jul. 20, 2018, 8 pages.

(Continued)

*Primary Examiner* — Tong-Ho Kim

(74) *Attorney, Agent, or Firm* — Yiding Wu; Haynes Beffel & Wolfeld LLP

(57) ABSTRACT

An integrated circuit includes a multilayer stack, and a plurality of layered conductors extending in the multilayer stack and into a conductor layer beneath the multilayer stack. The layered conductor has a bottom conductor layer in ohmic electrical contact with the conductive layer in a substrate, an intermediate conductive liner layer over the bottom conductor layer and lining a portion of sidewall of the corresponding trench, and a top conductor layer on the top conductive liner layer.

17 Claims, 19 Drawing Sheets

(56) References Cited

U.S. PATENT DOCUMENTS

| | | | |
|---|---|---|---|
| 9,728,551 B1* | 8/2017 | Lu | H01L 27/11582 |
| 2003/0205810 A1 | 11/2003 | Usami | |
| 2008/0138951 A1 | 6/2008 | Song | |
| 2012/0286392 A1* | 11/2012 | Pei | H01L 27/10829 |
| | | | 257/532 |
| 2014/0264525 A1* | 9/2014 | Takahashi | H01L 27/115 |
| | | | 257/314 |
| 2016/0268191 A1* | 9/2016 | Hu | H01L 27/11582 |
| 2016/0329343 A1 | 11/2016 | Pachamuthu et al. | |

OTHER PUBLICATIONS

EP Search Report in related application EP 17172773.0, dated Sep. 28, 2017, 6 pages.

Office Action in U.S. Appl. No. 15/462,201 dated Apr. 6, 2018, 16 pages.

Temple-Boyer et al. "Residual stress in low pressure chemical vapor deposition SiNx films deposited from silane and ammonia," Journal of Vacuum Sicent and Technology A: Vacuum, Surfaces, and Films 16 (4), Jul. 2998, 5 pages.

* cited by examiner

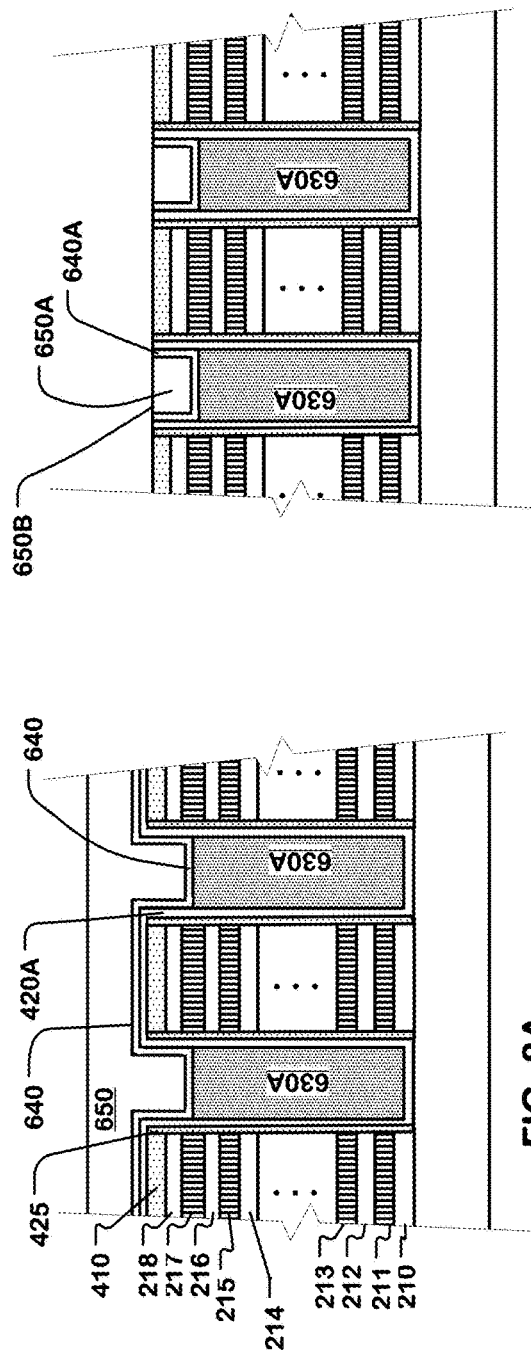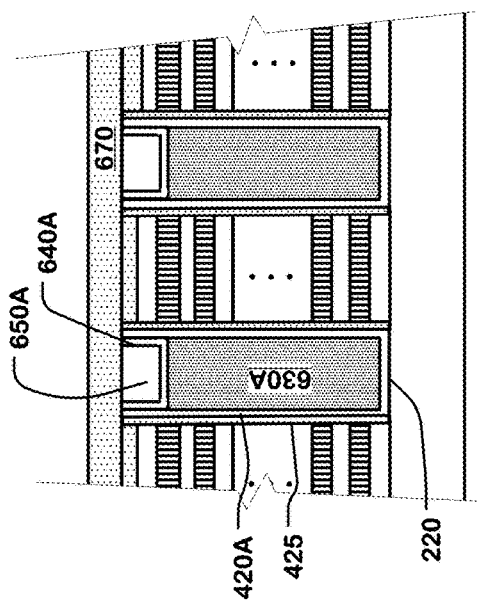

US 10,388,664 B2

INTEGRATED CIRCUIT DEVICE WITH LAYERED TRENCH CONDUCTORS

RELATED APPLICATIONS

This application is a continuation-in-part of U.S. patent application Ser. No. 15/462,201 filed on 17 Mar. 2017, which is incorporated by reference as if fully set forth herein.

BACKGROUND

Field

The present technology relates to integrated circuit devices, including high density memory devices, having trench conductors.

Description of Related Art

Stacking multiple levels of memory cells to achieve greater storage capacity has been proposed. Researchers have been developed various structures, such as Bit Cost Scalable (BiCS) memory, Terabit Cell Array Transistor (TCAT) and Vertical NAND (V-NAND). For these types of structures, and other complex structures that comprise stacks of active layers separated by insulating (or inactive) layers, it is often useful to form conductors connecting layers deep in the stacks with upper layers or with patterned metal layers over the stacks used for connection to peripheral circuits. When these conductors require low resistance or high current capacity, they can be formed by filling elongated trenches that are cut through the stacks, rather than in pillar shaped interlayer conductors formed in cylindrical or roughly cylindrical vias.

However, the formation of these conductor-filled trenches can be difficult. Once a high aspect ratio trench is formed in a stack of layers, it must be filled with a conductor. Filling deep trenches can stress the stacked structure. As the trench depth reaches and exceeds 1 micron, with an aspect ratio of 10 or more, the stress can cause deformation of the trench and of devices near the trench. This can be particularly problematic when there a multiple parallel conductors of this type being formed.

With the greater density storage, the structure would require more levels of memory cells, and with formation of deeper high aspect ratio trenches being required in the manufacturing process. Deformation of the trenches and of devices between the trenches can present challenges of connecting the conductive lines in the stack to the backend of line (BEOL) routings.

The illustration of FIG. 1 represents a three-dimensional (3D) NAND non-volatile memory device, which has a stack of alternating conductive layers (e.g. active layers 111, 113, 115, 117) and insulating layers (e.g. inactive layers 110, 112, 116, 118) on a substrate 100, with a plurality of memory pillars (e.g. 130-137) in the stack. As seen in FIG. 1, the illustrated trench conductors (conductive lines) 120, 121, 122, and 123 are deformed due to the process stresses, such as bending/warping of the wafer, the tensile/compressive stress caused by film deposition and thermal expansion due to changes in temperature, and so on. The illustration shows that such deformation can cause changes in the locations of the pillars and conductive lines. These changes in position can cause alignment problems with upper layer structures, and lead to misconnection to and/or misalignment of back-end-of-line (BEOL) routings.

Other integrated circuits include 2D or 3D circuit structures that include trench conductors as well that can be subject to bending and warping.

These problems are more likely to occur when the trench conductors are formed in trenches having aspect ratios of 10 or more, and depths of 1 micron or more.

It is desirable to form a plurality of trench conductors in a plurality of high-aspect-ratio trenches with reduced deformation. This can improve alignment tolerances for the BEOL routings and other structures, and otherwise improve reliability and density in integrated circuits.

SUMMARY

Processes for making elongated, conductor-filled trenches (i.e. trench conductors) and the resulting structures are described, which can reduce stress induced deformation of the device being formed. Thus, in one aspect, an integrated circuit described herein comprises a circuit structure, that can comprise a multilayer stack of active and inactive layers, over a substrate; a plurality of elongated trenches in the circuit structure, the elongated trenches in the plurality extending through the circuit structure to the substrate beneath the multilayer stack, and having sidewalls; and a plurality of layered trench conductors filling the corresponding elongated trenches in the plurality of elongated trenches. In embodiments described herein, a layered trench conductor in the plurality of trench layered conductors includes a bottom conductor layer in electrical contact with the substrate, a top conductor layer over the bottom conductor layer, and an intermediate dielectric or conductive layer between the top conductor layer and a portion of the sidewalls of the corresponding trench.

According to another aspect, a trench conductor in the plurality of trench conductor includes a liner conductor conformal with sidewalls of a corresponding elongated trench and in electrical contact with the substrate. A first fill body fills a lower portion of the elongated trench between the sidewalls of the corresponding elongated trench over the liner conductor. The first fill body as an upper surface recessed from the top surface of the circuit structure. A top conductor body feels an upper portion of the elongated trench between the sidewalls of the corresponding elongated trench over the liner conductor, and in current flow communication with the liner conductor. An embodiment is described in which the top conductor body includes a liner layer lining the upper portion of the corresponding elongated trench over the liner conductor and a conductive fill. The liner layer can act as an adhesion layer for improved quality of the structure at the interface between the first fill body and the top conductor body.

In an embodiment described, the fill body has a stress characteristic that is effective to compensate for stress induced by the top conductor body on the circuit structure. This can reduce or eliminate warping of the circuit structure caused by the formation of a plurality of trench conductors through it. In an example described herein, the fill body comprises a dielectric material.

In another aspect, a method of making an integrated circuit described herein comprises forming a multilayer stack of active and inactive layers over a substrate; forming a plurality of elongated trenches in the multilayer stack, the elongated trenches in the plurality of elongated trenches extending from an upper layer of the multilayer stack to the substrate beneath the multilayer stack; lining sides of the elongated trenches in the plurality of elongated trenches with an insulating spacer layer; and filling the elongated trenches in the plurality of elongated trenches with layered trench conductors as described in various forms above.

In one aspect the method includes forming the layered conductors in the corresponding elongated trenches in the plurality of elongated trenches by forming a bottom conductor layer in the corresponding trench over the insulating layer and in electrical contact with the substrate, forming an intermediate conductive liner layer over the bottom conductor layer and lining a portion of the insulating layer, and forming a top conductor layer on the intermediate conductive liner layer.

Also, a method described herein includes forming a circuit structure over a substrate, and forming a plurality of elongated trenches in the circuit structure. The elongated changers in this method extend from an upper layer of the circuit structure to the substrate beneath the circuit structure and have sidewalls. Method includes depositing a liner conductor conformal with sidewalls of the elongated trenches and in electrical contact with the substrate. Also, the method includes forming a fill body by filling lower portions of the elongated trenches between the sidewalls over the liner conductor, and recessing the upper surface of the fill body from the top surface of the circuit structure. Also, the method includes depositing a top conductor body to fill upper portions of the elongated trenches between the sidewalls over the liner conductor, and in current flow communication with the liner conductor.

In yet another aspect, an integrated circuit described herein comprises a plurality of trenches extending in a stack of active and inactive layers and into a conductive plate beneath the stack; a plurality of layered conductors filling the corresponding trenches in the plurality of trenches, each layered conductor including a bottom conductor layer in electrical contact with the conductive plate, an intermediate conductive liner layer over the bottom conductor layer and lining a portion of sidewall of the corresponding trench, and a top conductor layer on the intermediate conductive liner layer; and a plurality of pillars in the stack between a pair of the layered conductors in the plurality of layered conductors, memory cells disposed at interface regions between the active layers and the pillars.

Other aspects and advantages of the present technology can be seen on review of the drawings, the detailed description and the claims, which follow.

BRIEF DESCRIPTION OF THE DRAWINGS

FIGS. 8A, 8B and 8C illustrate structures during an alternative manufacturing process, which can be contrasted with FIG. 8.

DETAILED DESCRIPTION

A detailed description of embodiments of the present invention is provided with reference to the FIGS. 2-16.

FIGS. 2 through 9 illustrate an example process flow for an integrated circuit comprising a vertical channel three-dimensional structure in a first embodiment.

Figure 1:
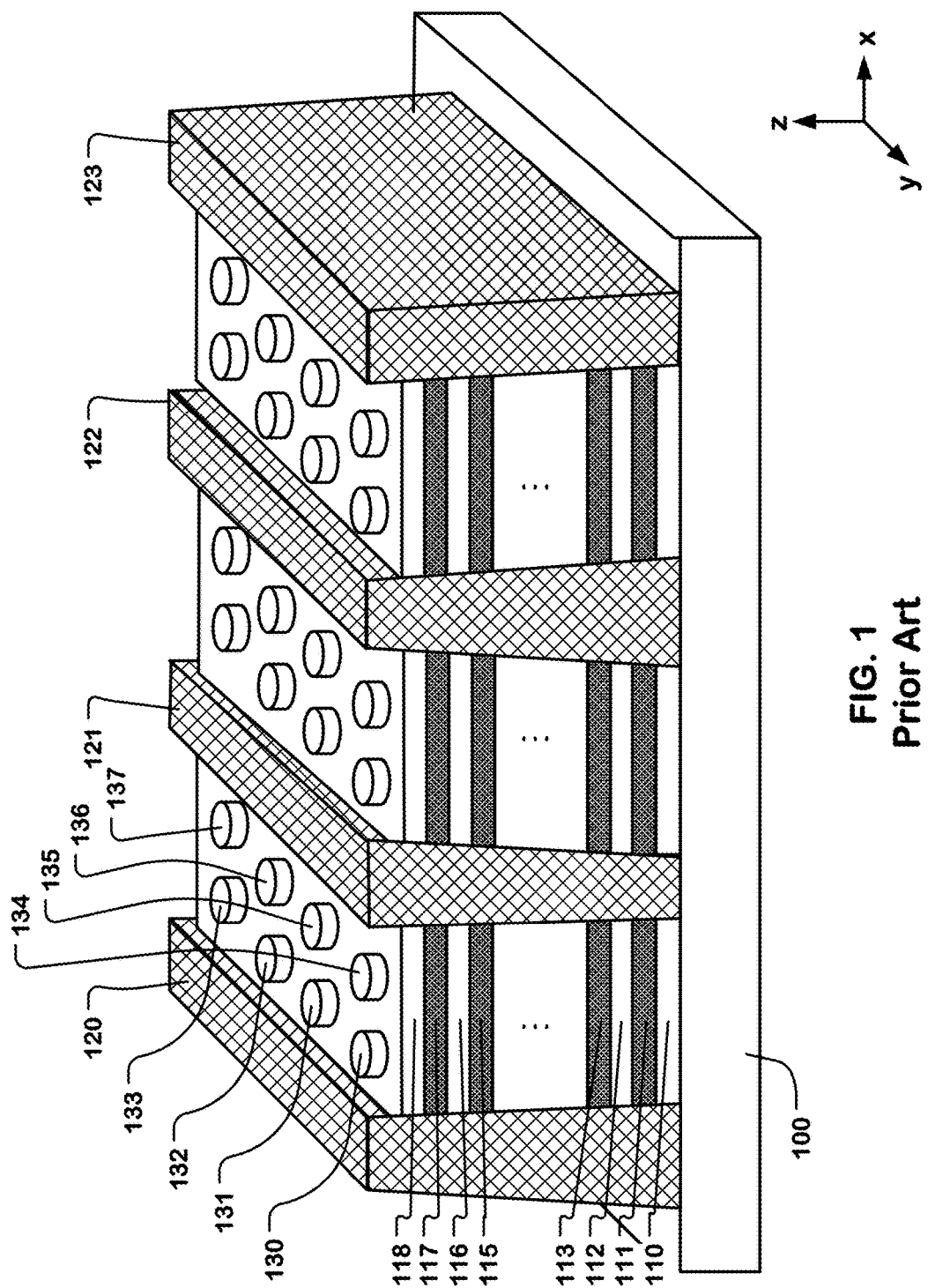
FIG. 1 is a perspective view illustrating deformation in a prior 3D memory device.
Figure 2:
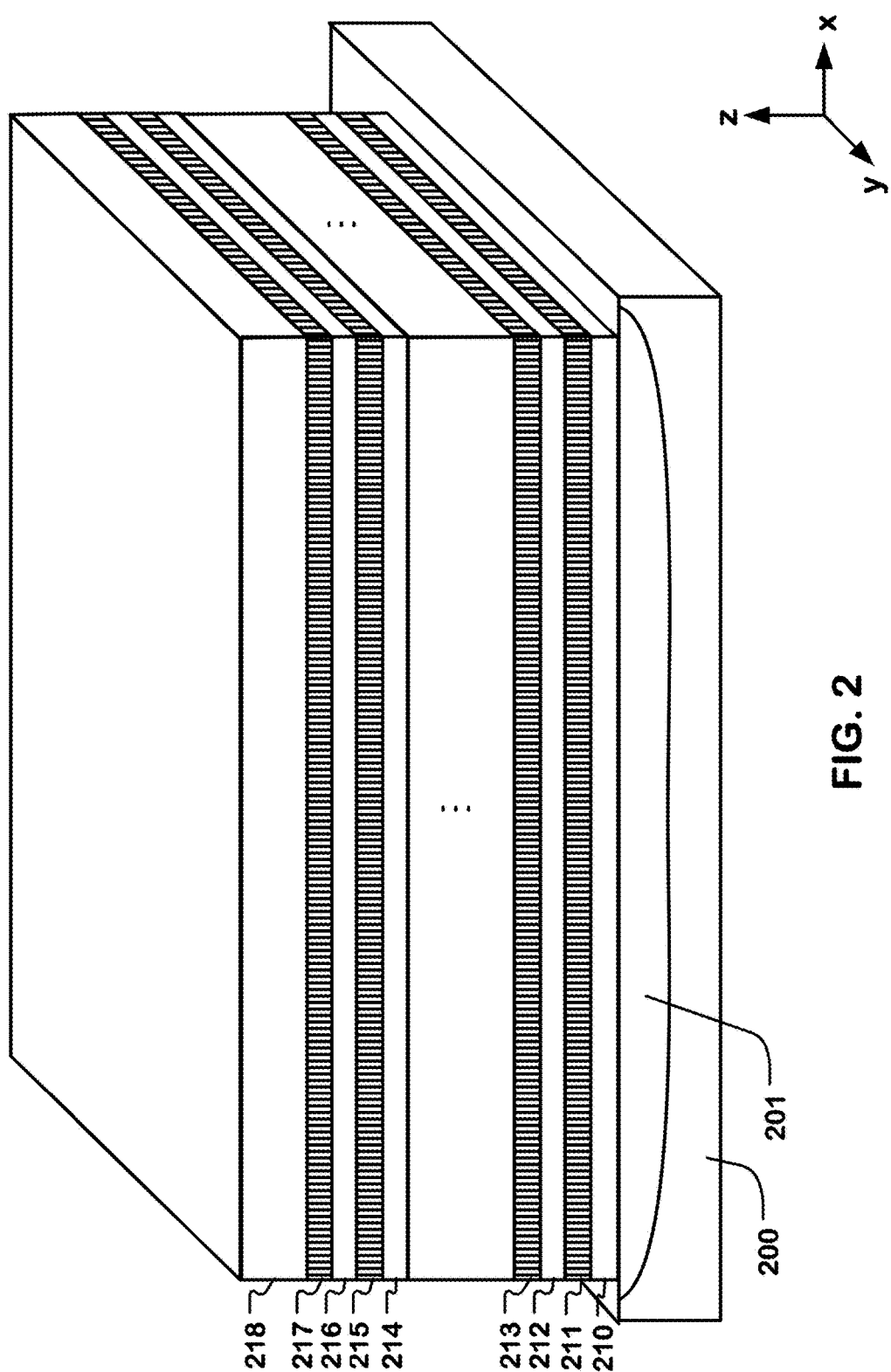
FIGS. 2-9 are perspective views illustrating structures during manufacturing stages for a 3D NAND memory in one embodiment as described herein.

FIG. 2 is a perspective view illustrating a stage of the process after formation of a circuit structure, which comprises in this example a stack of active and inactive layers over a substrate 200. The term "substrate" as used herein refers to any structure below the conductor-filled trenches describe herein, and can include multiple layers including more active and inactive layers, complex structures, such as underlying circuitry, bulk semiconductor of the wafer die, and so on. The substrate 200 can be for example a bounded conductive plate formed by a doping process, in which n-type or p-type doping materials are added to a semiconductor layer or bulk semiconductor to form a conductive layer 201. Then, a stack comprising active layers (e.g. 211, 213, 215, 217), inactive layers (e.g. 210, 212, 214, 216), and a top layer 218 is formed deposited over the substrate 200 by any suitable deposition method, such as PVD, CVD, LPCVD or ALD. The number of layers in the stack depends in the case of a memory device, on the design and density of the memory device. The active layers (e.g. 211, 213, 215, 217) in the stack comprise circuit structures of conductive material, such as doped/undoped polysilicon or metals. The inactive layers (e.g. 210, 212, 214, 216) in the stack may comprise silicon oxide, other insulating materials, and combinations of insulating materials. In this example, all of the inactive layers consist of the same material. In other examples, different materials can be used in different layers as suits a particular design goal. The top layer 218 can comprise a cap of for example insulating materials like silicon oxide, silicon nitride, high-density plasma oxide (HDPDX), and the combinations thereof.

Figure 3:
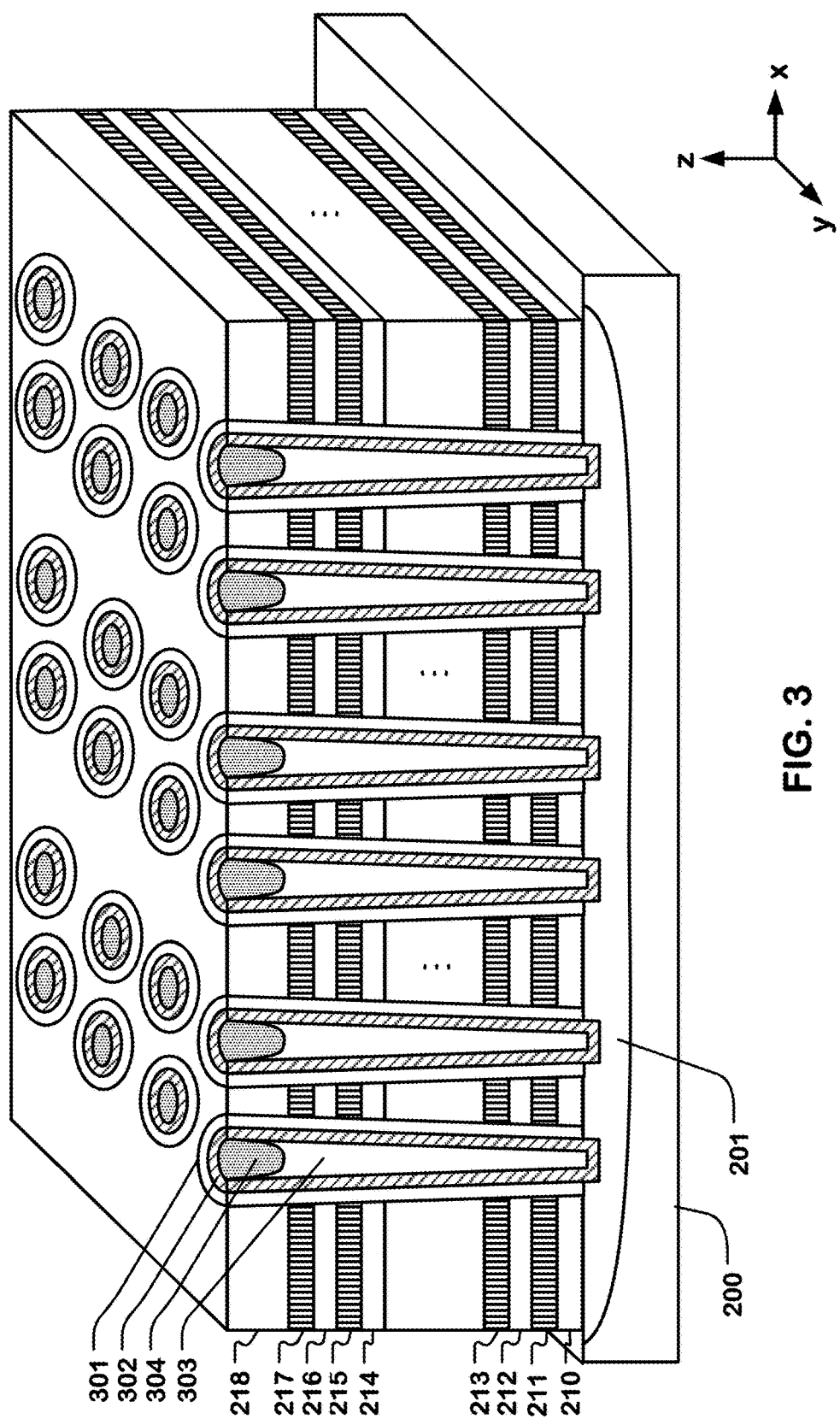

FIG. 3 is a perspective view illustrating a stage of the process after formation of a plurality of pillars through the stack into the substrate 200. A hole etch is implemented to form a plurality of cylindrical openings through the stack, followed by deposition of a memory layer 301 on the stack and within the openings in the plurality. The memory layer 301 can be a composite, multilayer film comprising a first layer, a second layer, and a third layer. The memory layer 301 has a conformal surface on the sidewalls and bottoms of the openings.

The first layer formed on the sidewalls of the openings comprises silicon oxide having a thickness of about 50 Å to 130 Å, and acts as a blocking layer. Other blocking dielectrics can include high-κ materials like aluminum oxide of 150 Å.

The second layer formed on the first layer comprises silicon nitride having a thickness of about 40 Å to 90 Å, and acts as a charge trapping layer. Other charge trapping materials and structures may be employed, including, for example, silicon oxynitride ($Si_xO_yN_z$), silicon-rich nitride, silicon-rich oxide, trapping layers including embedded nano-particles and so on.

The third layer formed on the second layer comprises silicon oxide having a thickness of about 20 Å to 60 Å, and acts as a tunneling layer. In another example, other tunneling materials and structures may be employed, for example, composite tunneling structure.

A composite tunneling structure can comprise a layer of silicon oxide less than 2 nm thick, a layer of silicon nitride less than 3 nm thick, and a layer of silicon oxide less than 4 nm thick. In one embodiment, the composite tunneling structure consists of an ultrathin silicon oxide layer $O_1$ (e.g. ≤15 Å), an ultrathin silicon nitride layer $N_1$ (e.g. ≤30 Å) and an ultrathin silicon oxide layer $O_2$ (e.g. ≤35 Å), which results in an increase in the valence band energy level of about 2.6 eV at an offset 15 Å or less from the interface with the semiconductor body. The $O_2$ layer separates the $N_1$ layer from the charge trapping layer, at a second offset (e.g. about 30 Å to 45 Å from the interface), by a region of lower valence band energy level (higher hole tunneling barrier) and higher conduction band energy level. The electric field sufficient to induce hole tunneling raises the valence band energy level after the second location to a level that effectively eliminates the hole tunneling barrier, because the second location is at a greater distance from the interface. Therefore, the $O_2$ layer does not significantly interfere with the electric field assisted hole tunneling, while improving the ability of the engineered tunneling dielectric to block leakage during low fields.

The deposition techniques applied to form the composite, multilayer film can be carried out by low-pressure chemical vapor deposition (LPCVD), atomic layer deposition (ALD), other suitable methods, or combinations.

Next, an etch process is carried out to remove the memory layer 301 on the top of the stack and the bottoms of the openings. A thin film 302 is then deposited over the stack and has a portion in contact with the conductive layer 201 at the bottoms of the openings. The thin film 302 can comprise a semiconductor adapted by choice of material, e.g. silicon, and doping concentrations, e.g. undoped or lightly doped, to act as vertical channel structures.

After formation of the semiconductor thin film 302, a fill-in process is implemented using a spin-on dielectric (SOD), for example silicon oxide or other insulating materials, to fill the space between the thin film 302 within the openings, followed by a CMP process to remove the SOD on the top conductor layer 218 and an etch process to remove the SOD in the upper portions of the openings. So the insulating structures 303 are formed. In one example, the insulating structure 303 can be completely filled with the SOD, and be free of voids and seams. In another example, a seam or a void may exist in the insulating structure 303.

Next, a conductive material, for example polysilicon, is deposited to fill the upper portions of the openings, followed by CMP and/or etch back processes to form the plugs 304, thereby providing connections from the channels in the vertical strings of memory cells to the corresponding overlying patterned conductors (not shown). A salicide process is optionally applied to lower the resistance for better conductivity. In another example, the plugs 304 may comprise doped polysilicon.

In yet another example, the insulating structure 303 can be a seam or a gap, which is formed during the deposition of the thin film 302. The overhangs formed on the top of the inside surface of the thin film 302 may connect together so as to form the seam or gap enclosed by the thin film 302. The plug 304 is therefore formed by the overhangs being connected.

In yet another example, the thin film 302 completely fills the openings in the stack, and therefore, the insulating structure 303 and the plug 304 do not exist.

The pillars in the plurality in the stack include the memory layer 301 and the thin film 302. The memory cells are disposed at the interface regions between the active layers and the pillars. In this embodiment, the active layers acting as the word lines surround the pillar, which constitutes the all-around gates. The memory cells have gate-all-around configuration.

Figure 4:
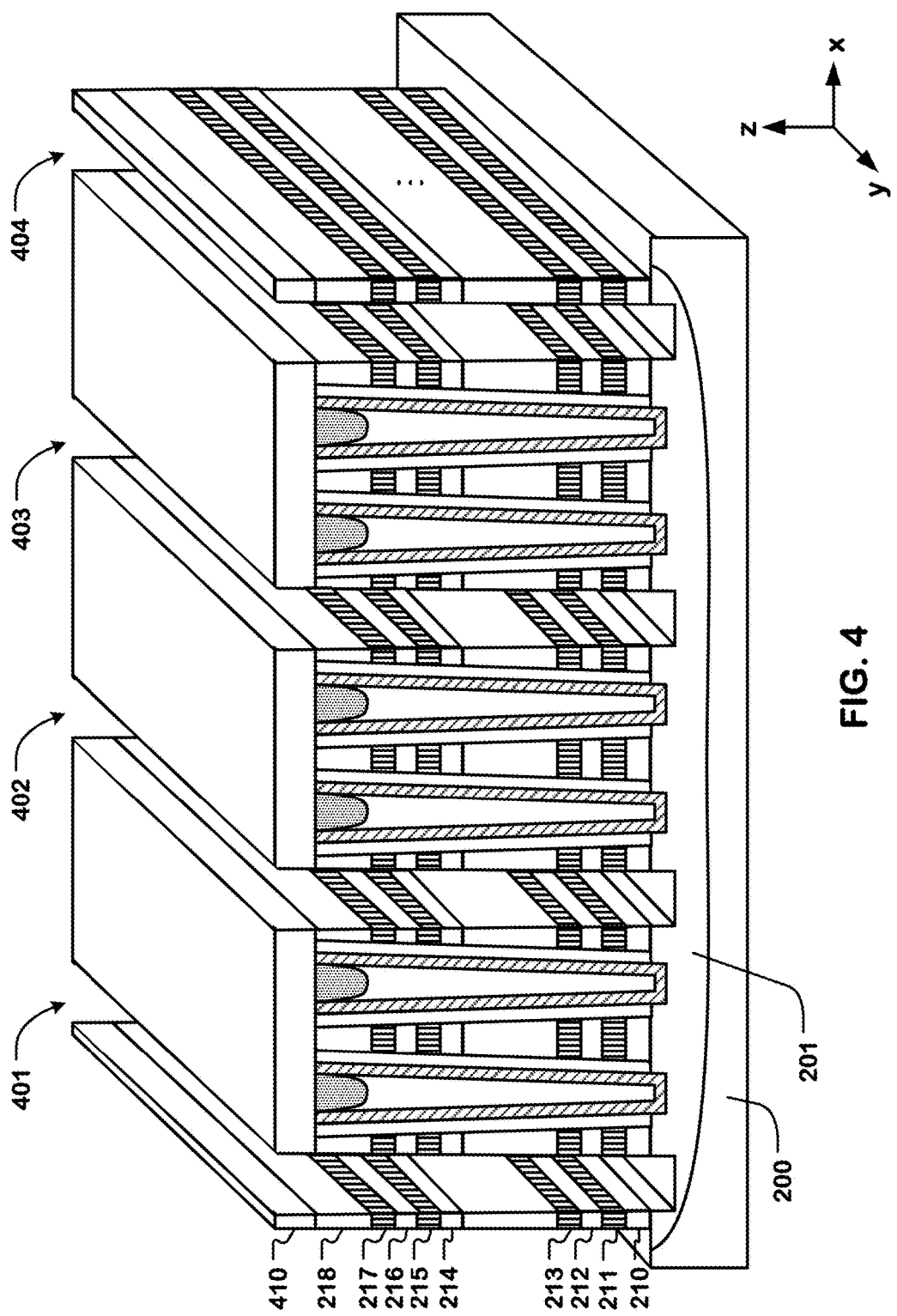

FIG. 4 is a perspective view illustrating a stage of the process after forming a plurality of elongated trenches in the multilayer stack, the elongated trenches in the plurality extending from an upper layer of the multilayer stack to the substrate beneath the multilayer stack using a single etch pattern. A cap layer 410, comprising for example silicon oxide, silicon nitride or other insulating materials, is formed over the stack, followed by creating a mask using photo lithography techniques for the patterning process to form a plurality of elongated trenches (e.g. 401, 402, 403, 404) in the stack and into the conductive layer 201 of the substrate 200. The elongated trenches in the plurality can be greater than 1 μm deep, up to 8 μm for example, and greater than 0.1 μm wide, up to 0.8 μm for example. As such, the elongated trenches in the plurality have an aspect ratio of 10 or more.

The elongated trenches in the plurality are formed using one single patterning step, in which includes defining an etch mask for trenches, and etching using the mask, without further etch masks, so as to have continuous sidewalls extending from an upper layer of the multilayer stack to the substrate 200 beneath the multilayer stack. The term "continuous sidewalls" as used herein refers to sidewalls of a structure that results from use of a single etch pattern (which may be defined using a single etch mask, a multilayer etch mask including photoresist and a hard mask, or otherwise) in the etching of the trenches from the top conductor layer to the bottom conductor layer. Trenches with "continuous sidewalls" may have undulations as a result of etching the multiple materials of the multilayer stack including changing etch chemistries for different layers in the stack, but have no discontinuity as a result of multiple patterning steps using multiple etch patterns such as can be used in dual damascene processes.

The continuous sidewalls of the elongated trenches may be bowed or tapered or have other shaped profiles.

In other embodiments the 3D memory structure can be made using a so-called gate replacement process. In a gate replacement process, a stack of alternating materials including an insulator like silicon oxide and a sacrificial material like silicon nitride is formed. The stack is patterned to define an intermediate structure for the 3D structure, such as that shown in FIG. 4. The sacrificial material is removed and conductive gate material is deposited in the voids left. In the gate replacement process, the active layers comprise these patterned gate conductors.

Figure 5:
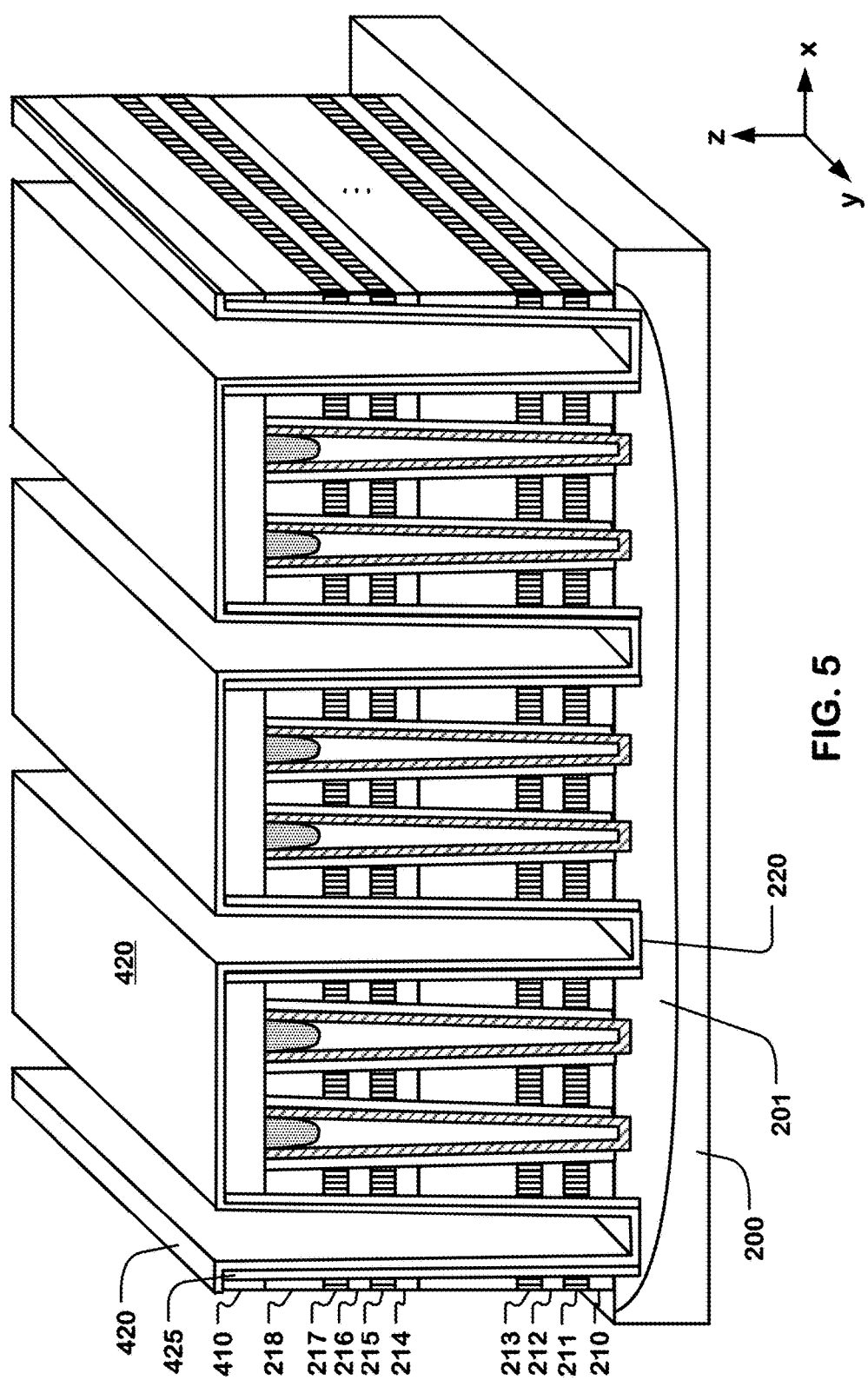

FIG. 5 is a perspective view illustrating a stage of the process after steps including conformal deposition of an insulating layer 425 on the sidewalls of the trenches, and removing the insulating layer 425 in the bottom of the trenches to leave insulating spacers, and to expose a conductive layer 201 of the substrate 200. Then, then forming a first conductive interface (or liner) layer 420 over the insulating layer 425 and over the cap layer 410 on the stack. Therefore, the first conductive liner layer 420 can be in contact at the bottom (e.g. 220) of the trench for current flow with the conductive layer 201 on the substrate 200.

The insulating layer 425 provides a continuous surface on the sidewalls of the trenches, which is considered the continuous sidewalls as described herein, and isolates the trench conductor from the circuit structures in the stack.

The insulating layer 425 comprises for example silicon oxide having a thickness of about 500 Å and may be formed at a low temperature, for example 25° C. The insulating layer 425 may comprise other insulating materials and formed using other deposition methods. The insulating layer 425 can also comprise silicon dioxide, silicon nitride, silicon oxynitride, and multilayer stacks like SiO2/SiN (e.g. SiO2/SiN/SiO2/SiN . . . ).

The first conductive liner layer 420 (also referred to as a liner conductor), such as a bi-layer combination of titanium and titanium nitride, may be deposited using chemical vapor deposition CVD, physical vapor deposition PVD, and atomic layer deposition ALD to form a layer that can be for example, about 30 Å to 1000 Å thick in this example. Other materials suitable for the first conductive liner layer 420 which can be used include single and multi-layer structures that comprise Titanium (Ti), titanium nitride (TiN), tungsten nitride (WN), tantalum (Ta), tantalum nitride (TaN), other metals and metal alloys, or combinations thereof. An annealing process is then optionally applied to the deposited first conductive liner layer 420.

Figure 6:
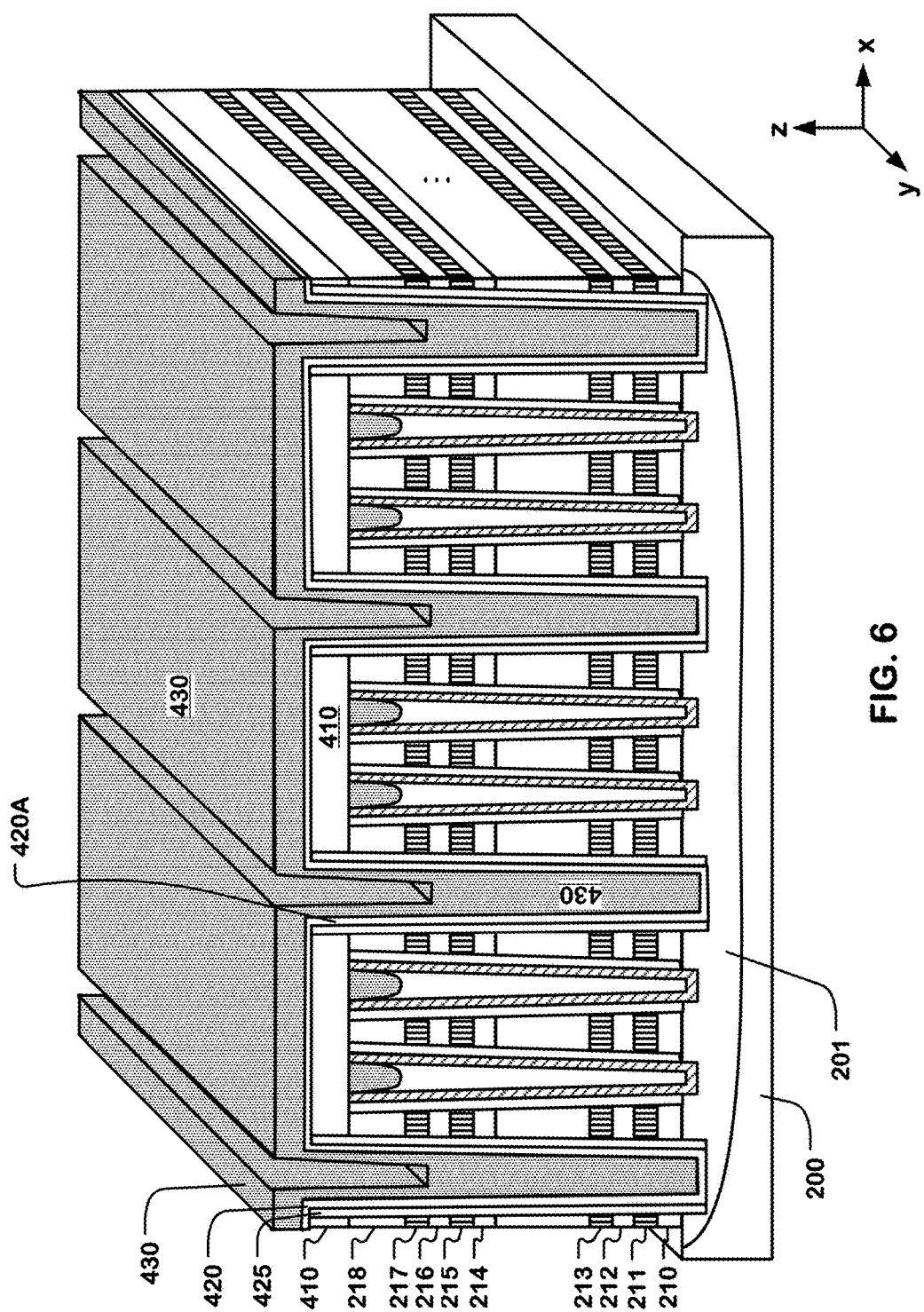

FIG. 6 is a perspective view illustrating a stage of the process after deposition of a first conducting layer 430 such as tungsten to form a fill body in the trenches. The first conducting layer 430 may be formed using CVD, PVD, ALD, electroplating (EP) or other deposition techniques to partially fill in the space of the first conductive liner layer 420 on the inner sidewalls of the trenches (e.g. liner conductor 420A) with a conductive fill material. In this embodiment, the first conducting layer 430 fills the lower portions of the trenches in the plurality between the sidewalls and contacts the liner conductor 420A. Other suitable materials for the first conducting layer 430 may comprise polysilicon, amorphous silicon, Titanium (Ti), titanium nitride (TiN), tungsten nitride (WN), tantalum (Ta), tantalum nitride (TaN), aluminum (Al), copper (Cu), cobalt (Co), other metals and metal alloys, or combinations thereof. An annealing process is then optionally applied.

Figure 7:
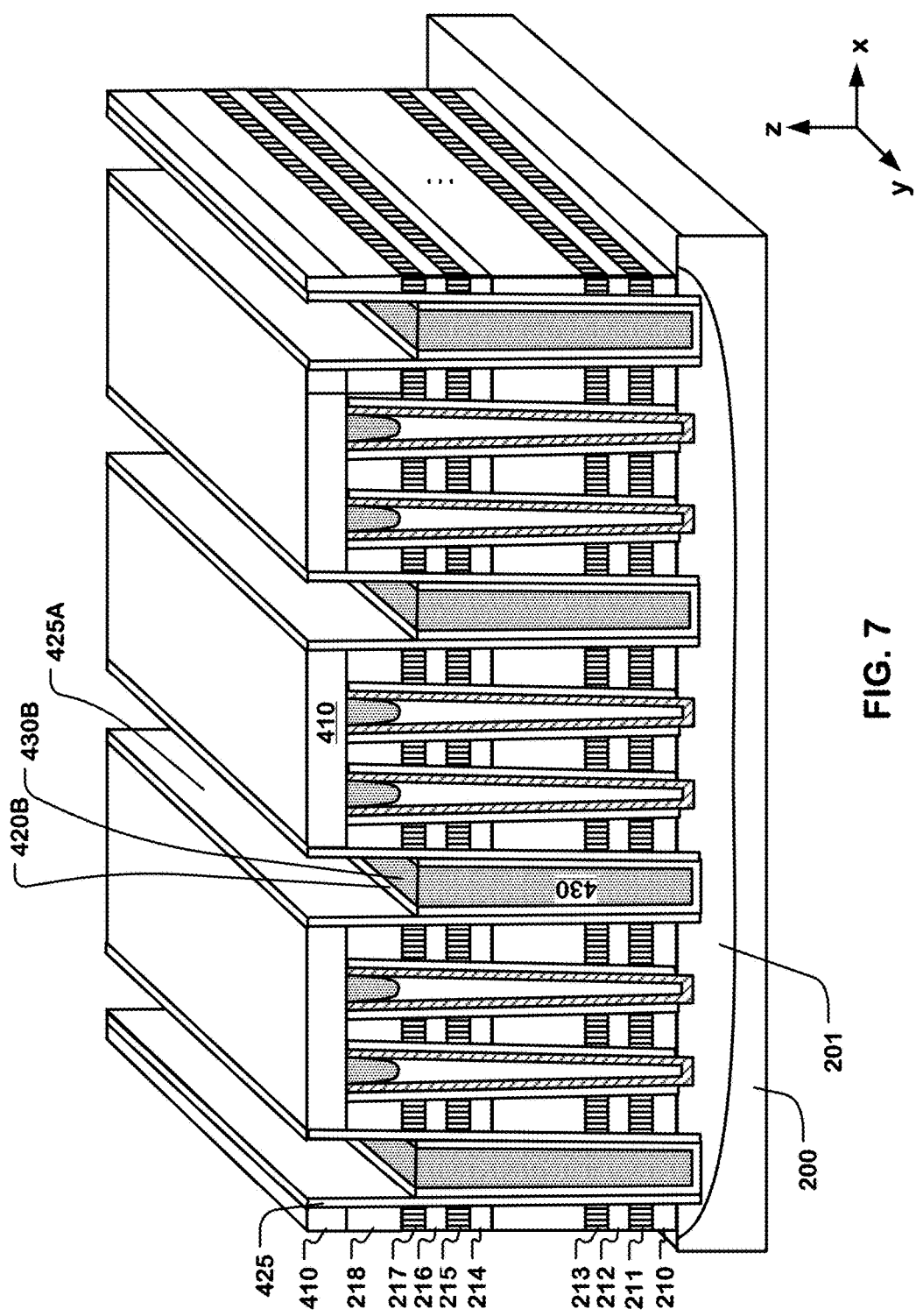

FIG. 7 is a perspective view illustrating a stage of the process after formation of the lower portion of a layered conductor in the respective one of trenches in the plurality. In one example, a CMP process is first applied to remove the first conductive liner layer 420 and the first conducting layer 430 on the top of the cap layer 410, followed by an etch process to anisotropically remove the first conductive liner layer 420 and the first conducting layer 430 on the upper sidewalls of the trenches to expose a spacer layer 425A of insulating layer 425. The conductive materials for the first conducting layer 430 and the first conductive liner layer 420 are etched back to an upper surface 420B, 430B in the stack forming a top surface recessed from the upper surface of the circuit structure. In this example, the top surface 430B of the first conducting layer 430 can be at an elevation about two-thirds of the stack thickness, or can be at an elevation around the top active layer (e.g. 217) of the stack. The etch process can comprise wet etching, dry etching, Ar bombardment, or the combinations thereof. In another example, the CMP process may be omitted so that only etching is performed to form the structure as illustrated in FIG. 7. The insulating spacer layer 425A on the sidewalls of the trenches provides an etch selectivity when the first conductive liner layer 420 and first conducting layer 430 are etched back to recess the upper surface 420B, 430B of fill body formed thereby.

As the trenches in the plurality are partially filled, the stack would have more space for thermal expansion during process while inducing less transverse stress on the stack. In addition, the partially filled high-aspect-ratio-trenches would decrease the tensile stress so as to improve the deformation issue.

Figure 8:
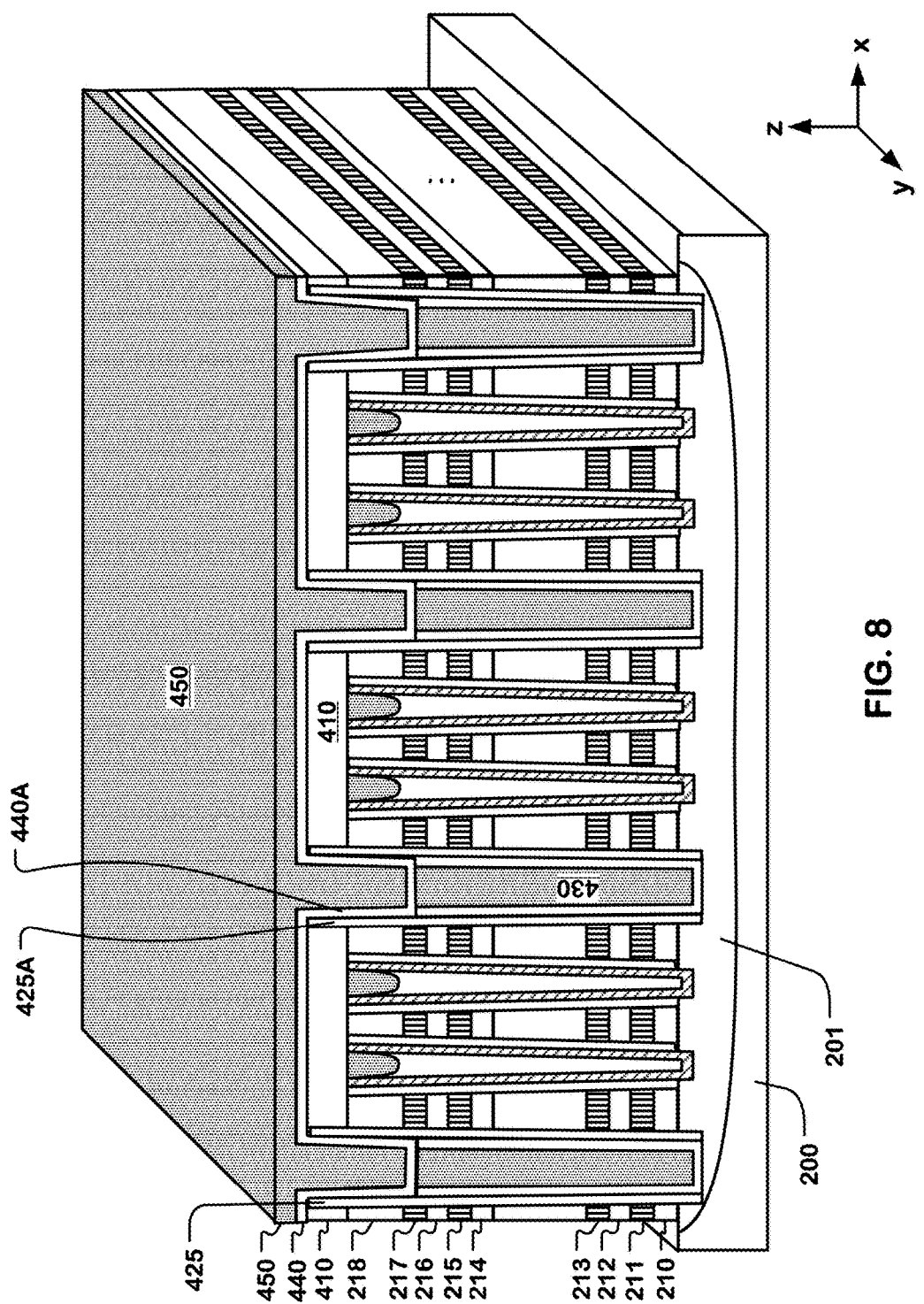

FIG. 8 is a perspective view illustrating a stage of the process after formation of a second conducting layer 450 on a second conductive liner layer 440 on the exposed portion of the insulating layer 425 as part of a process to form a top conductor body. The second conductive liner layer 440 can be formed using CVD, PVD, ALD, or other deposition techniques has a thickness about 10 Å to 1000 Å, in trench liner 440A segment lining a portion of the sidewalls of the trenches, thereby using the insulating spacer layer 425A for alignment of the multiple layers of the conductors.

The second conducting layer 450, which can be different than the first conducting layer, is deposited to fill the upper portion of the trenches using CVD, PVD, ALD, EP or other deposition techniques. The material suitable for the second conducting layer 450 may comprise polysilicon, amorphous silicon, Titanium (Ti), titanium nitride (TiN), tungsten (W), tungsten nitride (WN), tantalum (Ta), tantalum nitride (TaN), aluminum (Al), copper (Cu), cobalt (Co), other metals and metal alloys, or combinations thereof. The material used for the second conducting layer 450 can be chosen so that the stress characteristics of the material are offset or balanced by the stress characteristics of the material used in the first conducting layer 430.

In some embodiments, the trench filling step can be done before the pillar formation.

Figure 9:
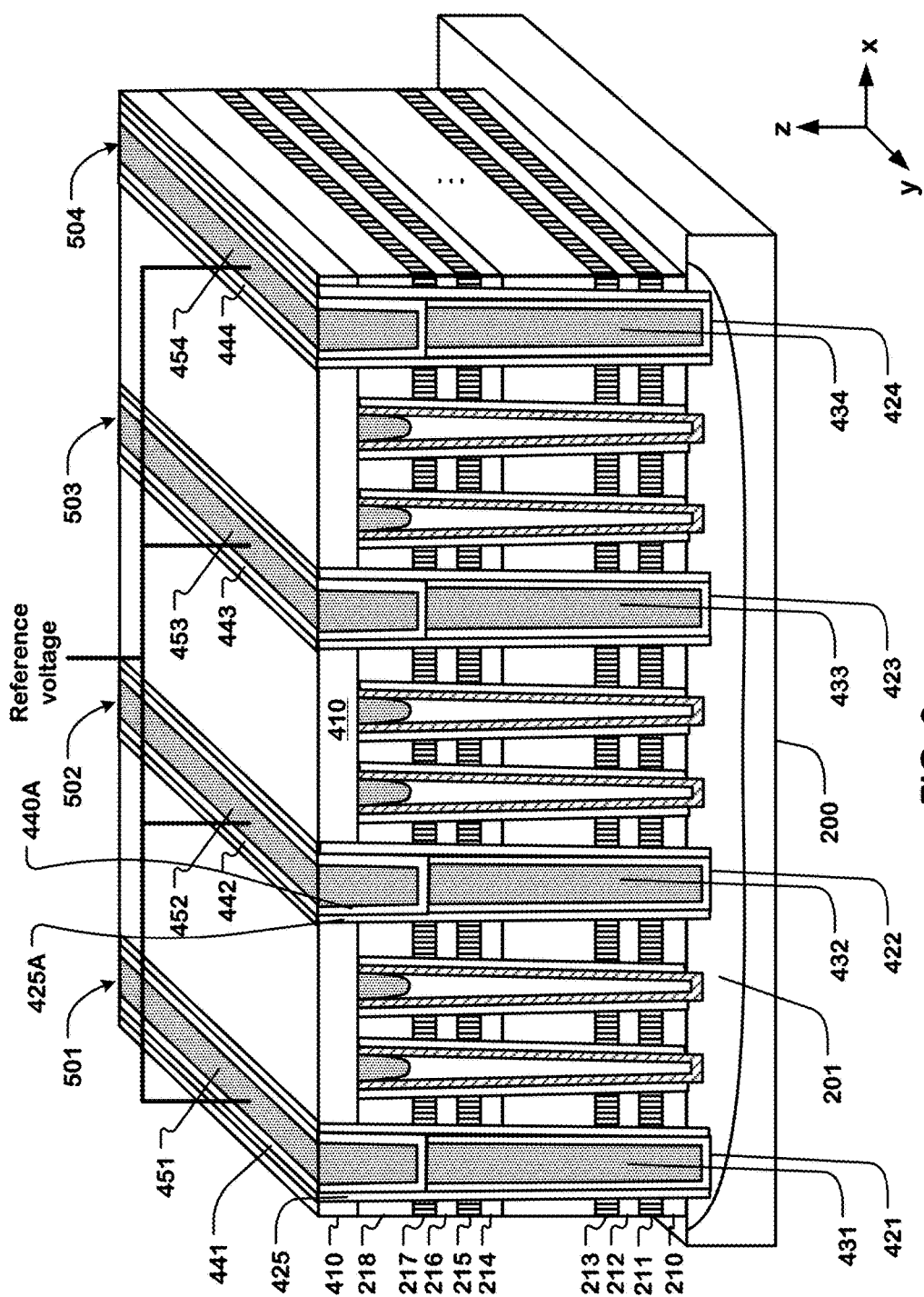

FIG. 9 is a perspective view illustrating a stage of the process after formation of the top conductor body that forms an upper portion of a layered conductor in the respective trenches in the plurality. A CMP and/or planarizing etch process can be used to remove the second conductive liner layer (440 of FIG. 8) and the second conducting layer (450 of FIG. 8) on the top of the cap layer 410 to form the top conductor bodies in the trench conductors, the top conductor bodies including the trench liner segment 440A and the material of the second conducting layer remaining after the planarizing process. Although not shown in this illustration, a dielectric layer can be formed over the planarized structure.

Thus a plurality of layered trench conductors 501, 502, 503, 504 is formed in the corresponding plurality of trenches. Each of the layered trench conductors 501, 502, 503, 504 in the plurality includes a bottom conductor layer 431, 432, 433, 434 in ohmic electrical contact for current flow with the substrate 200, an intermediate conductive liner layer 441, 442, 443, 444 over the bottom conductor layer 431, 432, 433, 434 and lining a portion of the sidewall of the corresponding trench, and a top conductor layer 451, 452, 453, 454 on the intermediate conductive liner layer 441, 442, 443, 444. The ohmic contact provides for current flow communication with suitable resistance between the layered conductors filling the elongated trenches and the underlying conductive layer 201 to enable use of the conductive layer 201 as a common source line. Each layered conductor includes a bottom conductive liner layer 421, 422, 423, 424 between the bottom conductor layer 431, 432, 433, 434 and a lower portion of the sidewall adjacent the bottom conductor layer 431, 432, 433, 434 in this embodiment.

The bottom conductive liner layers 421, 422, 423, 424 may have the same material as the intermediate conductive liner layers 441, 442, 443, 444 in one example. In another example, the first and second conductive liner layers may have different materials.

Likewise, the bottom conductor layers 431, 432, 433, 434 forming a fill body may have the same material as the top conductor layers 451, 452, 453, 454 in one example. In another example, the top and bottom conductor layers forming the fill body and the top conductor body may have different materials, and can be selected to manage stress characteristics of the structure in a way that reduces unwanted deformation.

As schematically shown, a plurality of patterned conductors overlying the plurality of layered trench conductors 501, 502, 503, 504 and the multilayer stack is connected the plurality of layered trench conductors 501, 502, 503, 504 to a reference voltage, configured as a common source line. Contacts to the trench conductors are made by formation of aligned vias in an overlying dielectric layer, for example, which are filled with interlayer conductors. The reduced deformation improves alignment for these contacts. In addition, a second plurality of patterned conductors (not shown) overlying the multilayer stack each connects the respective one of the pillars in the plurality to a voltage supply, providing bit line voltages to the corresponding thin films (302 of FIG. 3) of the pillar, configured as bit lines. Control circuitry is configured to apply different bias voltages to the active layers and pillars in the multilayer stack, and can be configured to execute a program operation by which one, or more than one, bit of data can be stored in a selected memory cell.

The bottom conductor layers 431, 432, 433, 434 that form the fill bodies can be bulk conductors, used primarily as a conductor as opposed to as a thin film adhesion layer or thin film barrier layer, of the layered trench conductors 501, 502, 503 504. In effective embodiments, bottom conductor layers 431, 432, 433, 434 have a thickness greater than a combined height of at least two of the layers (e.g. layers 210, 211) in the stack. In effective embodiments, bottom conductor layers 431, 432, 433, 434 have a thickness of at least one-third of the stack height. In effective embodiments, bottom conductor layers 431, 432, 433, 434 have a thickness of at least two-thirds of the stack height, and other thicknesses sufficient to act as the primary bulk conductive material of the layered conductor in the trench. The bottom conductor layers 431, 432, 433, 434 can be thicker in a dimension normal to the substrate 200 than the top conductor layers 451, 452, 453, 454. The primary purpose of the bottom conductor layers 431, 432, 433, 434 is a bulk conductor.

The bottom conductive liner layers 421, 422, 423, 424 below the bottom conductor layers 431, 432, 433, 434 are thin films which can function primarily as adhesive to assist or ensure the adhesion of the bottom conductor layers to the insulating layer 425 or ion barriers to protect the underlying substrate 200 from attack by ions like fluorine and chlorine. The bottom conductive liner layers 421, 422, 423, 424 can also function to avoid forming voids or hillocks on the surface of the substrate during formation of the bottom conductor layers. In addition, the bottom conductive liner layers 421, 422, 423, 424 can help growth of the bottom conductor layers 431, 432, 433, 434.

The intermediate conductive liner layers 441, 442, 443, 444 are thin films which can function as primarily as adhesives to ensure the adhesion of the top conductor layers to the insulating layer 425 and can help growth of the top conductor layers 451, 452, 453, 454.

Figure 6A:
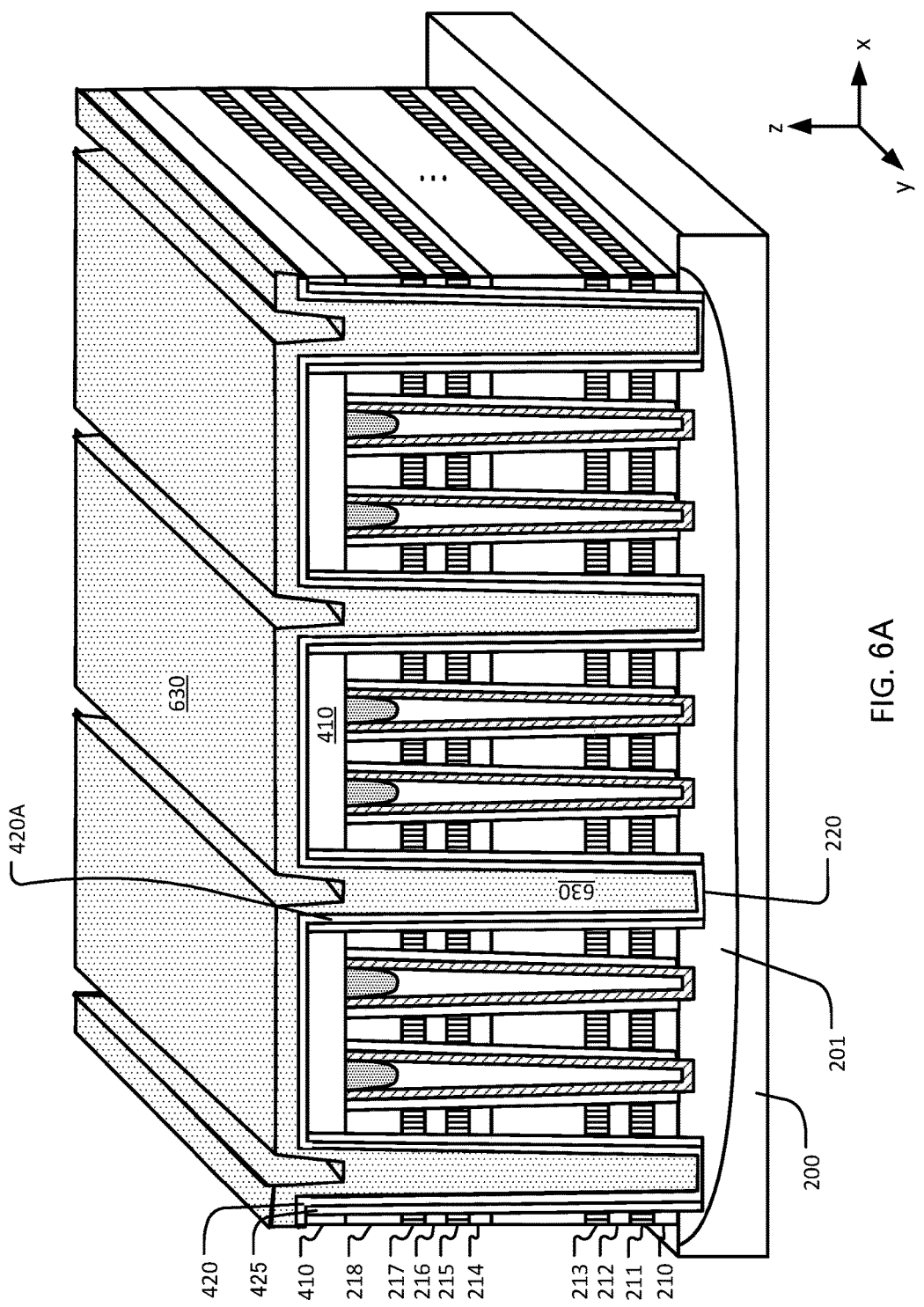
FIG. 6A illustrates a structure during an alternative manufacturing process, which can be contrasted with FIG. 6.

FIG. 6A illustrates an alternative embodiment, which can be contrasted with FIG. 6. In FIG. 6A, the components also found in FIG. 6 are giving the same reference numerals. In FIG. 6A, instead of depositing a first conducting layer 430 for use in forming the fill body, a stress balancing layer 630 is deposited. The stress balancing layer 630 overlies the conductive liner 420, 420A on the sides and bottom of the trenches.

The stress balancing layer 630 may be a dielectric material such as silicon dioxide, silicon nitride, silicon oxynitride formed using plasma enhanced chemical vapor deposition PECVD, high-density plasma oxidation HDP, atomic layer deposition ALD, low temperature oxide LTO, and or spin on dielectric SOD or other deposition techniques to partially fill in the space between the inner sidewalls of the first conductive layer 420A with a low stress material. In this embodiment, the stress balancing layer 630 fills the lower portions of the trenches in the plurality.

Figure 7A:
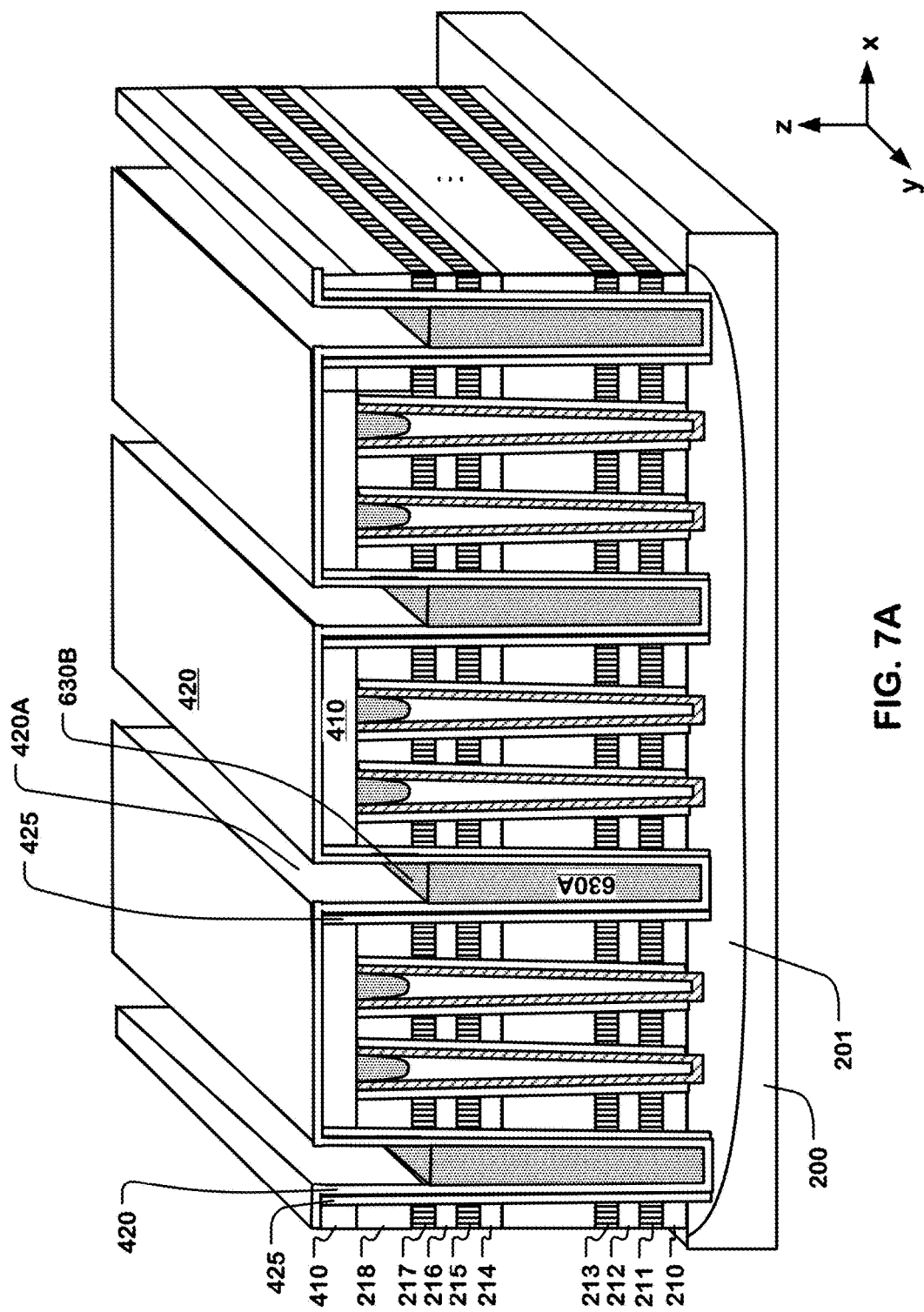
FIG. 7A illustrates a structure during an alternative manufacturing process, which can be contrasted with FIG. 7.

FIG. 7A is a perspective view illustrating a stage of the process after formation of the lower portion of a layered conductor in the respective one of trenches in the plurality, which can be contrasted with FIG. 7. In one example, a CMP process is first applied to remove the stress balancing layer 630 on the top of the cap layer 410, followed by an etch process to selectively remove the stress balancing layer 630 on the upper portions of the trenches while leaving the conductive liner formed by layer 420A on the sidewalls into upper portions of the trench, thus exposing a portion of conductive liner 420A. The materials for the stress balancing layer 630 are etched back to a top elevation in the stack forming a top surface 630B of the fill body 630A. In this example, the top surface of the fill body 630A formed of the stress balancing layer 630 can be at an elevation about two-thirds of the stack thickness, or can be at an elevation around the top active layer (e.g. 217) of the stack. The etch process can comprise wet etching, dry etching, Ar bombardment, or the combinations thereof. In another example, the CMP process may be omitted so that only etching is performed to form the structure as illustrated in FIG. 7A. The liner conductor 420A on the sidewalls of the trenches provides an etch selectivity relative to the stress balancing layer 630.

As the trenches in the plurality are partially filled, the stack would have more space for thermal expansion during process while inducing less transverse stress on the stack. In addition, the partially filled high-aspect-ratio-trenches would decrease the tensile stress so as to improve the deformation issue.

FIGS. 8A, 8B and 8C are simplified cross-section view showing alternative steps, which can be contrasted with FIG. 8. In FIG. 8A is a perspective view illustrating a stage of the process after formation of a second conducting layer 650 on a second conductive liner layer 640 on and in ohmic contact for current flow communication with the exposed portion of the liner conductor 420A. The second conductive liner layer 640 formed using CVD, PVD, ALD, or other deposition techniques has a thickness about 10 Å to 1000 Å, lining a portion of the sidewalls of the trenches, thereby using the conductive liner 420A for alignment of the multiple layers of the conductors.

The second conducting layer 650 fills the upper portion of the trenches, and can be deposited using CVD, PVD, ALD, EP or other deposition techniques. Materials suitable for the second conducting layer 650 may comprise polysilicon, amorphous silicon, Titanium (Ti), titanium nitride (TiN), tungsten (W), tungsten nitride (WN), tantalum (Ta), tantalum nitride (TaN), aluminum (Al), copper (Cu), cobalt (Co), other metals and metal alloys, or combinations thereof.

FIG. 8B illustrates another stage in the alternative process. In this stage, a CMP process or an etch back process has been applied to planarize the structure at a surface 650B, which process removes the liner conductor 420, the second conductive liner layer 640, and the second conducting layer 650 over the circuit structure and above the surface 650B of the remaining top conductor body as illustrated in the figure. As a result, a top conductor body is left in the upper portions of the trench which includes a portion 650A of the second conducting layer 650 and a portion 640A of the second conductive liner layer 640. Also, the top surface of the liner conductor 420A is coplanar with the surface 650B of the top conductor body. Thus, the trench conductor results which includes a current path through the liner conductor 420A to the top conductor body. The fill body 630A can comprise a dielectric material as discussed above, and acts to balance or compensate for stress characteristics of the top conductor body.

FIG. 8C illustrates a next stage in the process, after deposition of a dielectric layer 670, such as an interlayer dielectric over the trench conductors and the circuit structure. Contacts as described with reference to FIG. 9 can then be formed for connection to overlying patterned conductors.

Referring back to FIG. 5, after deposition of the liner conductor 420, the trench has reduced width and depth as a function of the deposition process and the thickness of the liner conductor on the sidewalls and in the bottom of the trench. However, the depth of the lined trench (inside the liner conductor 420) at this step remains in some embodiments at least about 90%, and in some embodiments 95% or more, of the depth (1 to 8 microns) before the deposition of the liner conductor layer 420. Likewise, the width of the lined trench is reduced by the thickness of the liner conductor 420 on the sidewalls, and at this step remains in some embodiments at least 70%, or more, of the width (0.1 to 0.8 microns) of the trench before the deposition of the first conductive layer 420. The volume of the fill body and of the top conductor body make up a majority of the volume of the trench conductors, and contribute to the stress properties to a significant degree as a result of their volume relative to the liner conductor 420. As a result of the volume of material in the fill body 630A, the stress characteristics of the fill body 630A contribute to balancing stress characteristics of the top conductor body, and reduce bending or warping of the circuit structure.

Trench conductors are described herein that comprise multiple layers of differing materials. The different materials can have variant stress characteristics. For example, materials with tensile stress characteristics tend to pull on structures to which they are connected and materials with compressive stress characteristics tend to push on structures to which they are connected. These stress conditions can contribute to bending or warping of the circuit structure and of the trench conductors as discussed above.

By implementing trench conductors with multiple layers of differing materials, these stress characteristics can be balanced to reduce bending or warping.

For example, the top conductor body and the fill body in the embodiments described herein can have different stress characteristics, particularly during the formation of the trench conductors during formation of the trench conductors and other steps applied for completion of the integrated circuit during which the circuit structure may be prone to warp under unwanted stress conditions.

The following table shows generally stress balancing conditions that can be implemented using the technologies described herein. The first column in the table shows a stress characteristic of a top conductor body or upper conductor element in the trench conductor. The second column in the table shows a stress characteristic of the fill body in the same trench conductor. The third column lists the relative benefit of the combination of stress characteristics.

|   | Stress Top Conductor Body | Stress Fill Body | Effect |
|---|---|---|---|
| 1 | Tensile (++) | Tensile (++) | Worst |
| 2 | Tensile (++) | Relatively Low Tensile (+) | Worse |
| 3 | Tensile (++) | Relatively Low Compressive (−) | Better |
| 4 | Tensile (++) | Compressive (−−) | Best |
| 5 | Compressive (−−) | Tensile (++) | Best |
| 6 | Compressive (−−) | Relatively Low Tensile (+) | Better |
| 7 | Compressive (−−) | Relatively Low Compressive (−) | Worse |
| 8 | Compressive (−−) | Compressive (−−) | Worst |

The table illustrates eight possible conditions for the stress characteristics of the top conductor body and the fill body of the trench conductor in rows 1-8. For the purposes of this table, the top conductor body can be characterized by tensile stress (tensile ++) properties tending to pull on the adjacent circuit structure or by compressive stress (compressive −−) properties tending to push on the adjacent structure. These stress characteristics can be considered typical for good conductors (having relatively high conductivity) desirable for use as the top conductor body in trench conductors as described herein. For the purposes of this table, the fill body can have a wider range of stress characteristics, including tensile stress (tensile ++) properties, relatively low tensile stress (tensile +) properties, relatively low compressive stress (compressive −) properties and compressive stress (compressive −−) properties.

The stress characteristic of the fill body can be effective to compensate for stress induced by the top conductor body and the conditions where the stress characteristic of the top conductor body is of the opposite type of the stress characteristic of the fill body. Thus, in rows 3-6 of the table the effect of the combination is to balance stress in the trench conductor resulting in better or best quality of the trench conductor, as it relates to bending or warping.+

As discussed above, the process of forming a trench conductor using a plurality of layers of varying materials, can reduce bending or warping, even in the conditions represented by rows 1 and 2, and by rows 7 and 8 in the table. However, better or best results can be achieved using materials that can establish the conditions represented by rows 3-6.

The conditions represented by rows 3-6 can be achieved in some embodiments, when the fill body comprises a dielectric material and the top conductor body comprises a metal, doped semiconductor, or metal compound which are deposited in a manner that results in the opposite types of stress characteristics.

Other characteristics which can be utilized to improve stress balancing, include the relative volumes of the fill body and the other components of the trench conductor, the number of layers of different materials, and other features as discussed in more detail below.

Figure 10:
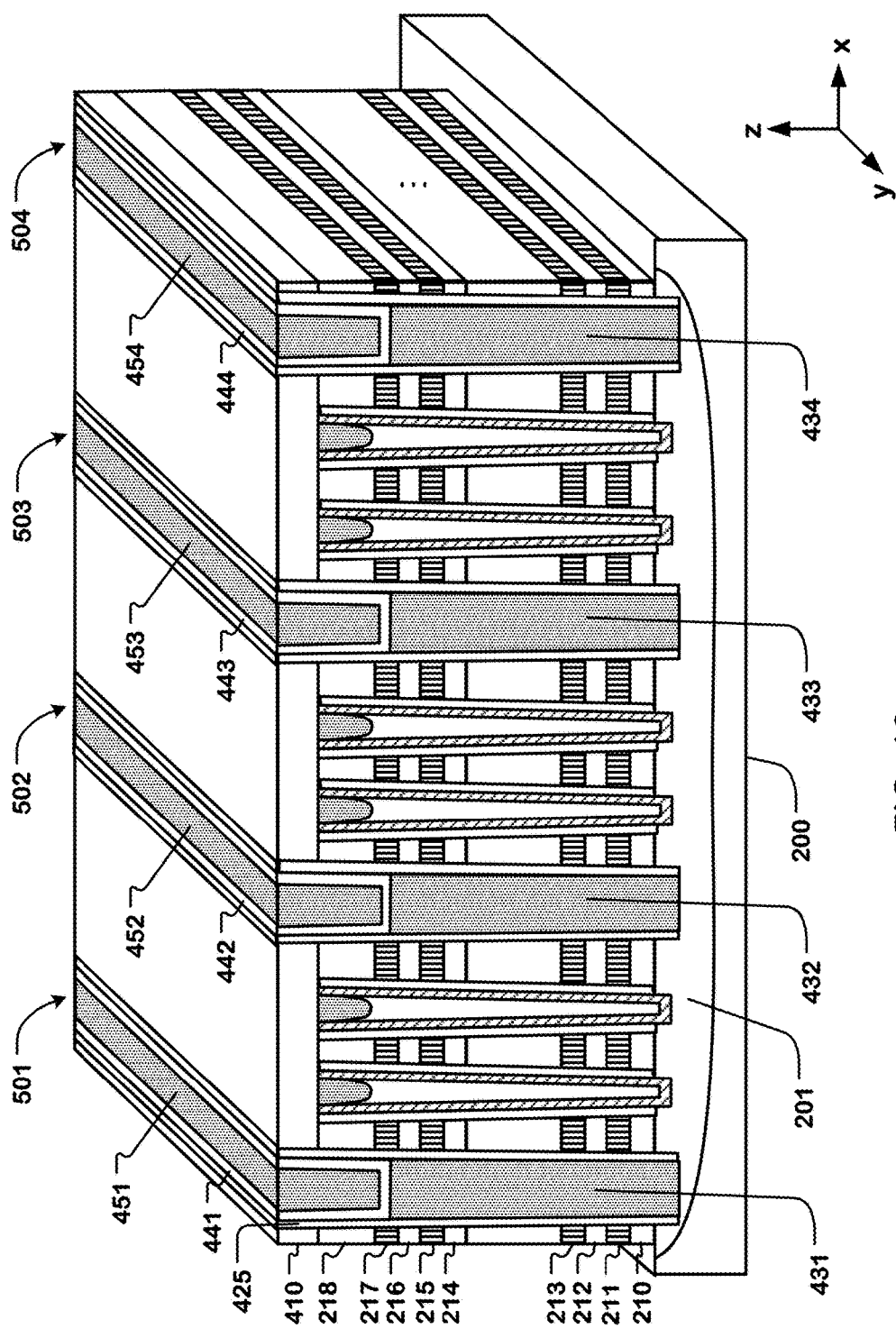
FIG. 10 is a perspective view illustrating a 3D NAND memory in another embodiment.

FIG. 10 is a perspective view of the three-dimensional memory structure in another embodiment. The same reference numerals used in FIG. 9 are generally applied to FIG. 10 to refer to the same or like elements of an embodiment.

Description about the same or like elements is not repeated. Compared with the structure of FIG. 9, the bottom conductor layer 431, 432, 433, 434 (fill body) directly contacts the conductive layer 201. In this embodiment, the bottom conductor layer can comprise for example polysilicon or other materials, which can provide good adhesion between the insulating and conducting materials. So the bottom conductive liner layers 421, 422, 423, 424 or liner conductors of FIG. 9 can be omitted. In this example, the bottom conductor layers 431. 432. 433. 434 can be thicker in a dimension normal to the substrate 200 than the top conductor layers 451. 452. 453, 454.

Figure 11:
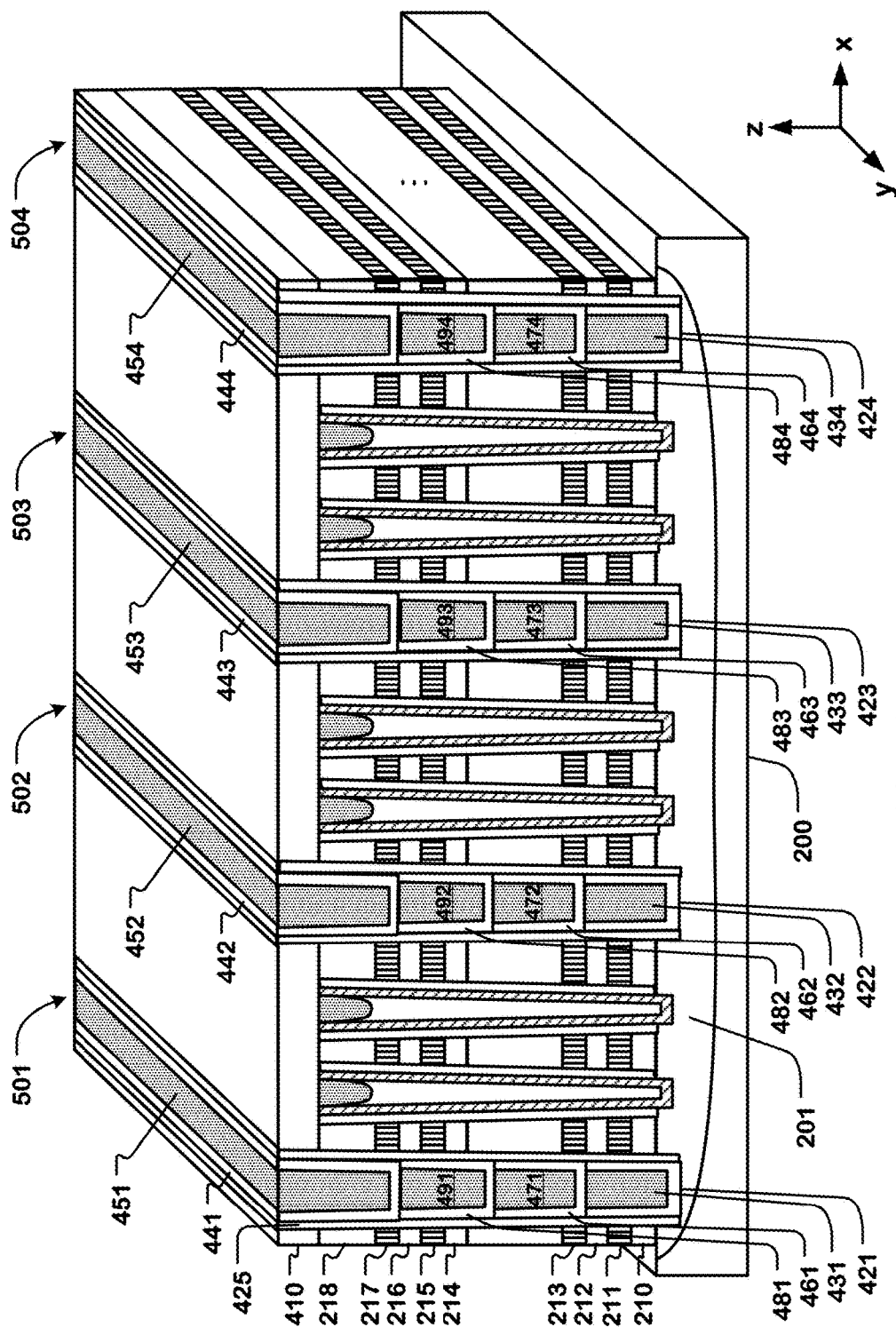
FIG. 11 is a perspective view +illustrating a 3D NAND memory in yet another embodiment.

FIG. 11 is a perspective view of the three-dimensional memory structure in yet another embodiment. The same reference numerals used in FIG. 9 are generally applied to FIG. 11 to refer to the same or like elements of an embodiment. Description about the same or like elements is not repeated. Compared with the structure of FIG. 9, each layered trench conductor in the corresponding trench includes an intermediate layer 471-474, 491-494 on an intermediate liner or conductive liner layer 461-464, 481-484 between the top conductor layer 451, 452, 453, 454 and the bottom conductor layer 431, 432, 433, 434. The intermediate layer can comprise a material selected for stress balancing effects, such as a dielectric material, or conductor or semiconductor materials as discussed above. In this embodiment, the layered conductor comprises two intermediate layers and two intermediate conductive liners or liner layers. The number of the intermediate conductor layers and intermediate conductive liner layers between the top and bottom conductor layers can be changed. The intermediate layers can comprise a material or materials selected for stress balancing effects, such as a dielectric material, or conductor or semiconductor materials as discussed above.

The intermediate conductive liners or conductive liner layers (461-464, 481-484) can function as adhesives to ensure the adhesion of the top conductor bodies to the insulating layer 425 and can help growth of the top conductor layers 451, 452, 453, 454 for the top conductor bodies. As the liner layers (441, 442, 443, 444) for the top conductor bodies are disposed on top of the intermediate conductive interface liners (461-464, 481-484) and adhere to the sidewalls of the trenches (the insulating layer 425), the intermediate conductive liner layers (e.g. 461-464, 481-484) between the top and bottom conductor layers can be optionally omitted.

Figure 12:
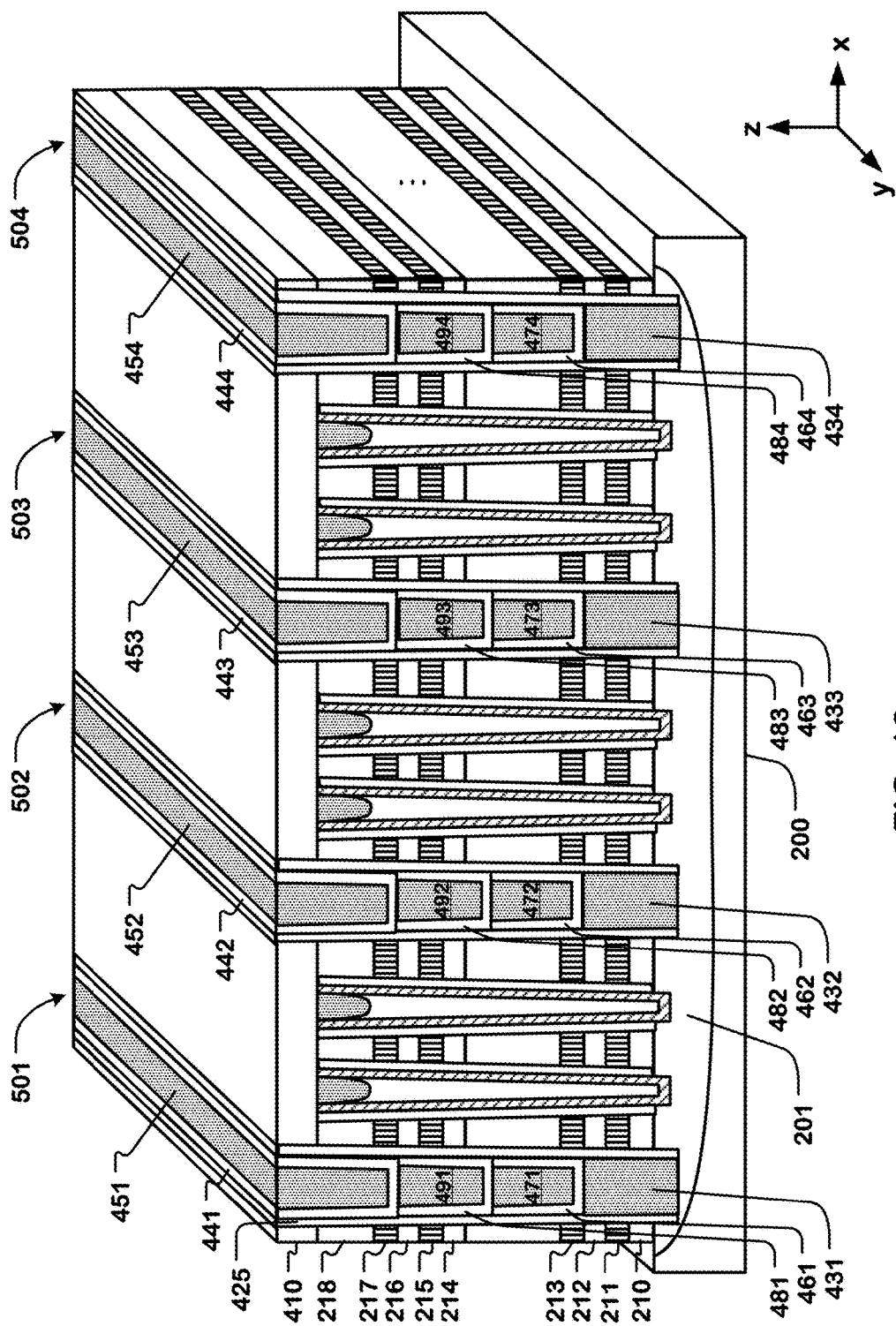
FIG. 12 is a perspective view illustrating a 3D NAND memory in an alternative embodiment.

FIG. 12 is a perspective view of the three-dimensional memory structure in an alternative embodiment. The same reference numerals used in FIG. 11 are generally applied to FIG. 12 to refer to the same or like elements of an embodiment. Description about the same or like elements is not repeated. Compared with the structure of FIG. 11, the bottom conductor layer 431, 432, 433, 434 directly contacts the conductive layer 201. In this embodiment, the bottom conductor layer comprises for example polysilicon, which can provide good adhesion between the insulating and conducting materials. So the bottom conductive liner layers 421, 422, 423, 424 of FIG. 9 can be omitted.

In yet an alternative embodiment, the intermediate conductive liner layers (e.g. 461-464, 481-484) between the top and bottom conductor layers can be optionally omitted.

Figure 13:
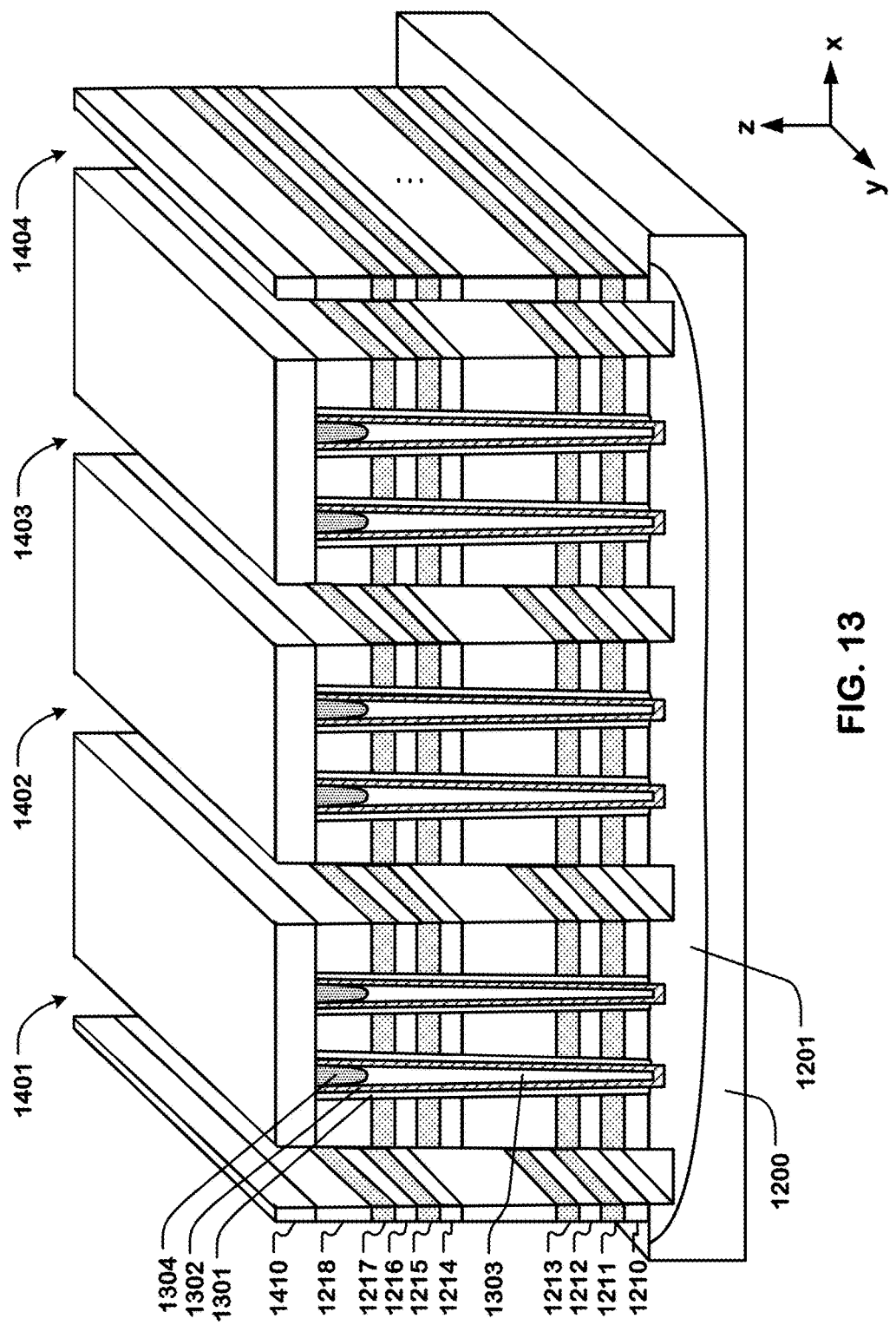
FIGS. 13-15 are perspective views illustrating a 3D NAND memory in structures during manufacturing stages for a 3D NAND memory in one embodiment as described herein
Figure 14:
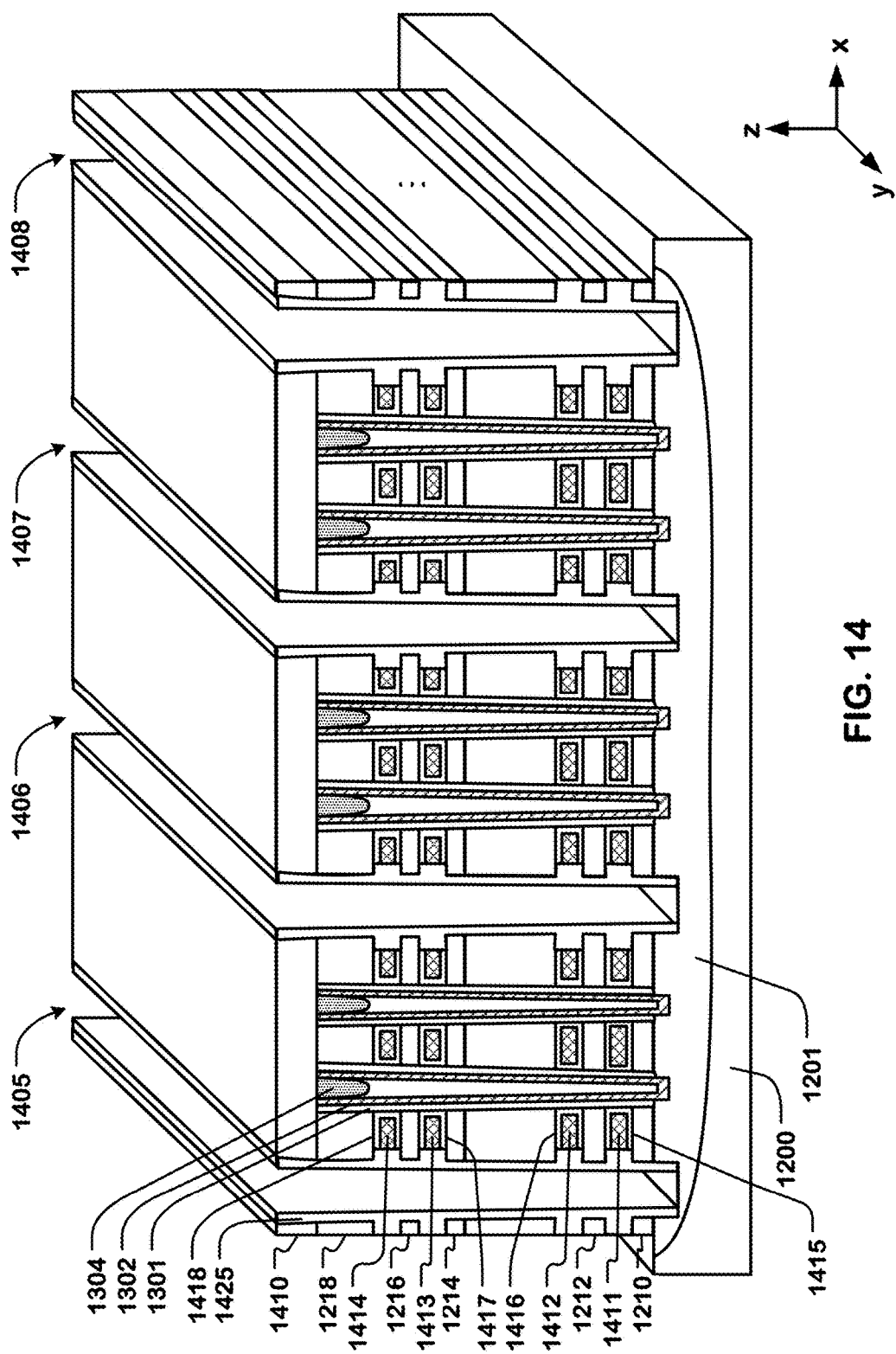
Figure 15:
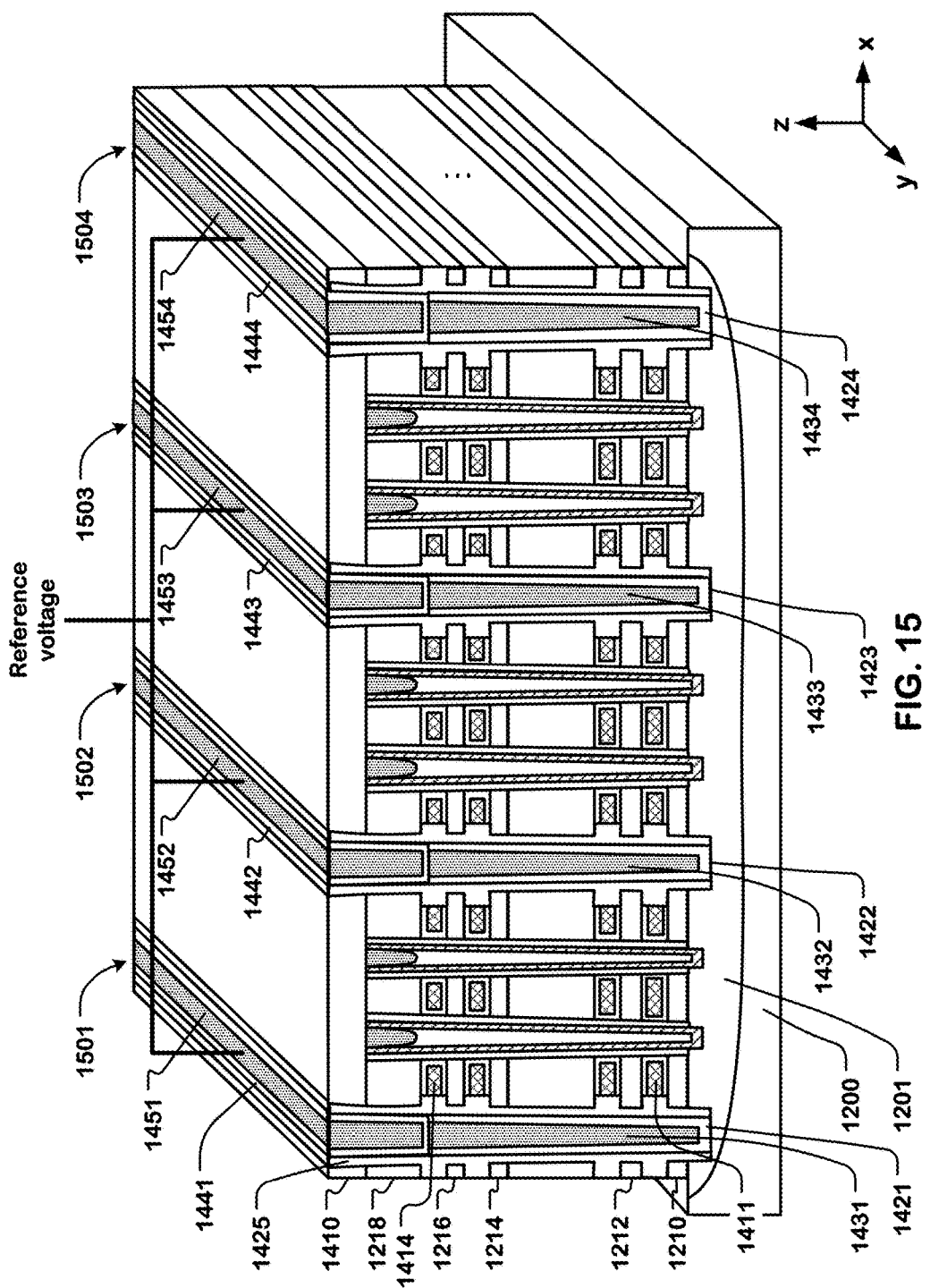

FIGS. 13 through 15 illustrate another example process flow for an integrated circuit comprising a vertical channel 3D memory device.

FIG. 13 is perspective view illustrating a structure having a plurality of elongated trenches (e.g. 1401, 1402, 1403, 1404) formed in a stack of alternating silicon oxide layers (e.g. 1210, 1212, 1214, 1216, 1218) and silicon nitride layers (e.g. 1211, 1213, 1215, 1217).

To form the structure as illustrated in FIG. 13, a substrate (or a conductive plate) 1200 can comprise a conductive layer 1201 formed by a doping process to add n-type or p-type doping materials to the substrate 1200, followed by deposition of a stack of alternating silicon oxide layers (e.g. 1210, 1212, 1214, 1216, 1218) and silicon nitride layers (e.g. 1211, 1213, 1215, 1217) on the substrate 1200.

Next, a hole etch is implemented to form a plurality of openings through the stack, followed by deposition of a memory layer 1301 on the stack and within the openings in the plurality. The memory layer 1301 is a composite, multilayer film comprising a first layer configured as a blocking layer comprising silicon oxide, a second layer configured as a charge trapping layer comprising silicon nitride, and a third layer configured as a tunneling comprising silicon oxide. The memory layer 1301 has a conformal surface on the sidewalls and bottoms of the openings in the plurality. Then, an etch process is carried out to remove the memory layer 1301 on the top of the stack and on the bottoms of the openings. A thin film 1302 is then deposited over the stack and has a portion in contact with the conductive layer 1201 at the bottoms of the openings. The thin film 1302 can comprise a semiconductor adapted by choice of material, e.g. silicon, and doping concentrations, e.g. undoped or lightly doped, to act as vertical channel structures.

After formation of the semiconductor thin film 1302, a fill-in process is implemented using a spin-on dielectric (SOD), for example silicon oxide or other insulating materials, to fill the space between the thin film 1302 within the openings, followed by a CMP process to remove the SOD on the top conductor layer 1218 and an etch process to remove the SOD in the upper portions of the openings. So the insulating structures 1303 are formed. In one example, the insulating structure 303 can be completely filled with the SOD, and be free of void and seam. In another example, a seam or a void may exist in the insulating structure 1303.

Next, a conductive material, for example polysilicon, is deposited to fill the upper portions of the openings, followed by CMP and/or etch back processes to form the plugs 1304, thereby providing connections from the channels in the vertical strings of memory cells to the corresponding overlying patterned conductors (not shown). A salicide process is optionally applied to lower the resistance for better conductivity. In another example, the plugs 1304 may comprise doped polysilicon.

In yet another example, the insulating structure 1303 can be a seam or a gap, which is formed during the deposition of the thin film 1302. The overhangs formed on the top of the inside surface of the thin film 1302 may connect together so as to form the seam or gap enclosed by the thin film 1302. The plug 1304 is therefore formed by the overhangs being connected.

In yet another example, the thin film 1302 completely fills the openings in the stack, and therefore, the insulating structure 1303 and the plug 1304 do not exist.

Next, a cap layer 1410 comprising for example silicon oxide is deposited on the stack, followed by a patterning process to form a plurality of elongated trenches (e.g. 1401, 1402, 1403, 1404) extending in the stack and into the conductive layer 201 of the substrate 200. The elongated trenches in the plurality can be greater than 1 μm deep, up to 8 μm for example, and greater than 0.1 μm wide, up to 0.8 μm for example. As such, the elongated trenches in the plurality have an aspect ratio of 10 or more.

The elongated trenches in the plurality are formed using one single patterning step, in which includes defining an etch mask for trenches, and etching using the mask, without further etch masks, so as to have continuous sidewalls extending from an upper layer of the multilayer stack to the substrate 1200 beneath the multilayer stack.

FIG. 14 is a perspective view illustrating a structure after formation of metal gates in place of the nitride layers in the stack and formation of an insulating layer 1425 on the sidewalls of the elongated trenches. A gate replacement process is implemented, which comprises (1) removing the silicon nitride layers (e.g. 1211, 1213, 1215, 1217 of FIG. 13) in the stack using phosphoric acid ($H_3PO_4$) to expose the surface of the silicon oxide layers and the surface of the memory layer, (2) forming a thin layer (e.g. 1415, 1416, 1417, 1418) of high-κ material like aluminum oxide on the exposed surface of the silicon oxide layers (e.g. 1210, 1212, 1214, 1216, 1218) in the stack and on the exposed surface of the memory layer 1301, and (3) forming the metal gates (e.g. 1411, 1412, 1413, 1414) using CVD or other suitable deposition methods by filling a conductive material like tungsten (W), tungsten nitride (WN), tantalum (Ta), tantalum nitride (TaN), titanium (Ti), titanium nitride (TiN), or the combinations thereof. A wet etch is then applied to remove the conductive material on the sidewalls and the bottoms of the elongated trenches, which creates recesses on the sidewalls.

After the gate replacement process, the stack comprises inactive layers consisting of the silicon oxide layers (e.g. 1210, 1212, 1214, 1216, 1218) and active layers consisting of the metal gates (e.g. 1411, 1412, 1413, 1414). The memory cells are disposed at the interface regions between the active layers and the pillars. In this embodiment, the active layers acting as the word lines surround the pillar, which constitutes the all-around gates. The memory cells have gate-all-around configuration.

Next, an oxidation process is implemented at a low temperature, for example 25° C. to form an insulating layer 1425 comprising silicon oxide over the stack, followed by an oxide etch to remove the insulating layer 1425 on the bottoms of the elongated trenches. The resulting structure has the insulating layer 1425 covering the sides of the silicon oxide layers (e.g. 1210, 1212, 1214, 1216, 1218) in the stack and filling the recesses on the sidewalls. After the etch step, the insulating layer 1425 provides continuous sidewalls of the elongated trenches (e.g. 1405, 1406, 1407, 1408).

FIG. 15 is a perspective view illustrating a structure having a plurality of layered conductors (e.g. 1501, 1502, 1503, 1504) filling the elongated trenches which can be implemented using any of the processes and structures described herein. In this example, a first conductive thin layer is deposited over the stack using CVD, PVD, and ALD to form a layer of about 30 Å to 1000 Å thick. An annealing process is then optionally applied to the deposited first conductive thin layer. A first conductor is followed to deposit using CVD, PVD, ALD, electroplating (EP) or other deposition techniques to partially fill in the space between the sidewalls of the first conductive thin layer within the elongated trenches. In this example, the first conductor fills the lower portion of the trenches in the plurality.

Next, a CMP process is first applied to remove the first conductive thin layer and the first conductor on the top of the cap layer 410, followed by an etch process to remove the first conductive thin layer and the first conductor on the upper sidewalls of the elongated trenches, thereby forming the bottom fill bodies (e.g. 1431, 1432, 1433, 1434) and the bottom conductive liner layers (e.g. 1421, 1422, 1423, 1424), and exposing a portion of insulating layer 1425 above the bottom fill bodies (e.g. 1431, 1432, 1433, 1434). The conductive materials for the bottom fill bodies (e.g. 1431, 1432, 1433, 1434) and for some embodiments for the the bottom conductive liner or liner layers (e.g. 1421, 1422, 1423, 1424) are etched back to a top elevation in the stack forming a top surface for the bottom fill bodies. In this example, the top surface of the bottom fill bodies (e.g. 1431, 1432, 1433, 1434) can be at an elevation about two-thirds of the stack thickness, or can be at an elevation around the top active layer (e.g. 1414) of the stack. The etch process can comprise wet etching, dry etching, Ar bombard, or the combinations thereof. In another example, only etch process(es) is implemented.

The material suitable for the bottom fill bodies (e.g. 1431, 1432, 1433, 1434) of the layered conductor (e.g. 1501, 1502, 1503, 1504) may comprise silicon nitride (SiN), Titanium (Ti), titanium nitride (TiN), tungsten nitride (WN), tantalum (Ta), tantalum nitride (TaN), other metal alloys, or combinations thereof.

The material suitable for the bottom conductive liner layer (e.g. 1421, 1422, 1423, 1424) of the layered conductor (e.g. 1501, 1502, 1503, 1504) may comprise polysilicon, amorphous silicon, Titanium (Ti), titanium nitride (TiN), tungsten (W), tungsten nitride (WN), tantalum (Ta), tantalum nitride (TaN), aluminum (Al), copper (Cu), cobalt (Co), other metals and metal alloys, or combinations thereof. The bottom conductive liner layer can be a combination of multiple layers, such as Ti and TiN.

A second conductive thin layer is then deposited on the exposed portion of the insulating layer 1425 and on the top surface of the bottom fill bodies using CVD, PVD, ALD, or other deposition techniques to have a thickness about 10 Å to 1000 Å, lining a portion of the sidewalls of the elongated trenches, followed by depositing a second conductor to fill the upper portion of the elongated trenches using CVD, PVD, ALD, EP or other deposition techniques. Then, a CMP and/or etch process is applied to remove the second conductive thin layer and the second conductor on the top of the cap layer 1410. So the top conductor layers (e.g. 1451, 1452, 1453, 1454) and the intermediate conductive liner layers (e.g. 1441, 1442, 1443, 1444) are formed on the corresponding bottom fill bodies (e.g. 1431, 1432, 1433, 1434).

The material suitable for the intermediate conductive liner layers (e.g. 1441, 1442, 1443, 1444) may comprise silicon nitride (SiN), Titanium (Ti), titanium nitride (TiN), tungsten nitride (WN), tantalum (Ta), tantalum nitride (TaN), other metal alloys, or combinations thereof. The intermediate conductive liner layer can be a combination of multiple layers, such as Ti and TiN.

The material suitable for the top conductor layer (e.g. 1451, 1452, 1453, 1454) may comprise polysilicon, amorphous silicon, Titanium (Ti), titanium nitride (TiN), tungsten (W), tungsten nitride (WN), tantalum (Ta), tantalum nitride (TaN), aluminum (Al), copper (Cu), cobalt (Co), other metals and metal alloys, or combinations thereof.

The top conductor bodies and bottom fill bodies can have the same or different materials. Likewise, the intermediate conductive liner layer and the bottom conductive liner layer can consist of the same or different materials. In embodiments described herein, the materials of the top conductor body and of the fill body are chosen for stress balancing effect.

Each of the layered conductors (e.g. 1501, 1502, 1503, 1504) in the plurality includes a bottom conductor layer (e.g. 1431, 1432, 1433, 1434) in ohmic electrical contact with the conductive layer 1201, an intermediate conductive liner layer (e.g. 1441,1442, 1443, 1444) over the bottom conductor layer (e.g. 1431, 1432, 1433, 1434) and lining a portion of the sidewall of the corresponding trench, and a top conductor layer (e.g. 1451, 1452, 1453, 1454) on the intermediate conductive liner layer (e.g. 1441, 1442, 1443, 1444). The ohmic contact provides for current flow communication with suitable resistance between the layered conductors filling the elongated trenches, and the underlying conductive layer 1201 to enable use of the conductive layer 1201 as a common source line. Each layered conductor also includes a bottom conductive liner layer (e.g. 1421, 1422, 1423, 1424) between the bottom conductor layer (e.g. 1431, 1432, 1433, 1434) and a lower portion of the sidewall adjacent the bottom conductor layer (e.g. 1431, 1432, 1433, 1434) in this embodiment.

As schematically shown, a plurality of patterned conductors overlying the plurality layered conductors (e.g. 1501, 1502, 1503, 1504) and the multilayer stack is connected the plurality of layered conductors to a reference voltage, configured as a common source line. In addition, a second plurality of patterned conductors (not shown) overlying the multilayer stack is connected the plurality of pillars to a voltage supply, providing bit line voltages to the corresponding thin films (1302 of FIG. 13) of the pillar, configured as bit lines. Control circuitry is configured to apply different bias voltages to the active layers and the pillars in the multilayer stack, and can be configured to execute a program operation by which one, or more than one, bit of data can be stored in a selected memory cell.

The bottom conductor layers 1431, 1432, 1433, 1434 can be bulk conductors, used primarily as a conductor as opposed to as a thin film adhesion layer or thin film barrier layer, of the layered conductors 1501, 1502, 1503 1504, having thicknesses sufficient to act as the primary bulk conductive material of the layered conductor in the trench. In effective embodiments, the bottom conductor layers 1431, 1432, 1433, 1434 have a thickness greater than a combined height of at least two of the layers (e.g. layers 1210, 1411) in the stack. In effective embodiments, the bottom conductor layers 1431, 1432, 1433, 1434 have a thickness of at least one-third of the stack height. In effective embodiments, the bottom conductor layers 1431, 1432, 1433, 1434 have a thickness of at least two-thirds of the stack height. The bottom conductor layers 1431, 1432, 1433, 1434 can be thicker in a dimension normal to the substrate 1200 than the top conductor layers 1451, 1452, 1453, 1454. The primary purpose of the bottom conductor layers 1431, 1432, 1433, 1434 is a bulk conductor in some embodiments.

In other embodiments the fill bodies are implemented primarily for stress balancing effect relative to the top conductor bodies. In these embodiments, the fill bodies can comprise dielectric material, or other materials not necessarily good conductors, and the bottom liner layer forms a conductive liner to provide for current flow to the top conductor body of the trench conductor.

The bottom conductive liner layers 1421, 1422, 1423, 1424 below the bottom fill bodies 1431, 1432, 1433, 1434 function primarily as adhesives to assist or ensure the adhesion of the bottom conductor layers to the insulating layer 425 or ion barriers to protect the underlying substrate 200 from attack by ions like fluorine and chlorine in some embodiments. The bottom conductive liner layers 1421, 1422, 1423, 1424 can also function to avoid forming voids or hillocks on the surface of the substrate during formation of the bottom conductor layers. In addition, the bottom conductive liner layers 1421, 1422, 1423, 1424 can help growth of the bottom conductor layers 1431, 1432, 1433, 1434. In some embodiments, and particularly when the fill bodies are not good conductors, the bottom conductive liner layers can act as conductive liners providing a current path to the top conductor body of the trench conductor.

The intermediate conductive liner layers 1441, 1442, 1443, 1444 can function in some embodiments as primarily as adhesives to ensure the adhesion of the top conductor layers to the insulating layer 1425 and can help growth of the top conductor layers 1451, 1452, 1453, 1454.

In another embodiment, the bottom conductive liner layer can be omitted if the bottom conductor layer comprises for example polysilicon or other materials, which can provide good adhesion between the insulating and conducting materials. In this embodiment, the layered conductors, as described with reference to FIG. 10, includes the bottom conductor layers in direct contact with the conductive layer 1201. The bottom conductor layers 1431, 1432, 1433, 1434 are thicker than the top conductor layers 1451. 1452. 1453, 1454 in a dimension normal to the substrate 1200.

In yet another embodiment, the layered conductors, as described with reference to FIG. 11, can include an intermediate fill body and an intermediate conductive liner layer between the top and bottom conductor layers. The intermediate conductive liner layer can be optionally omitted.

In yet another embodiment, the layered conductors, as described with reference to FIG. 12, can include an intermediate fill body and an intermediate conductive liner layer between the top and bottom conductive bodies. The intermediate conductive liner layers can be optionally omitted.

The layered conductors can be implemented in formation of other 3D memory structures.

Figure 16:
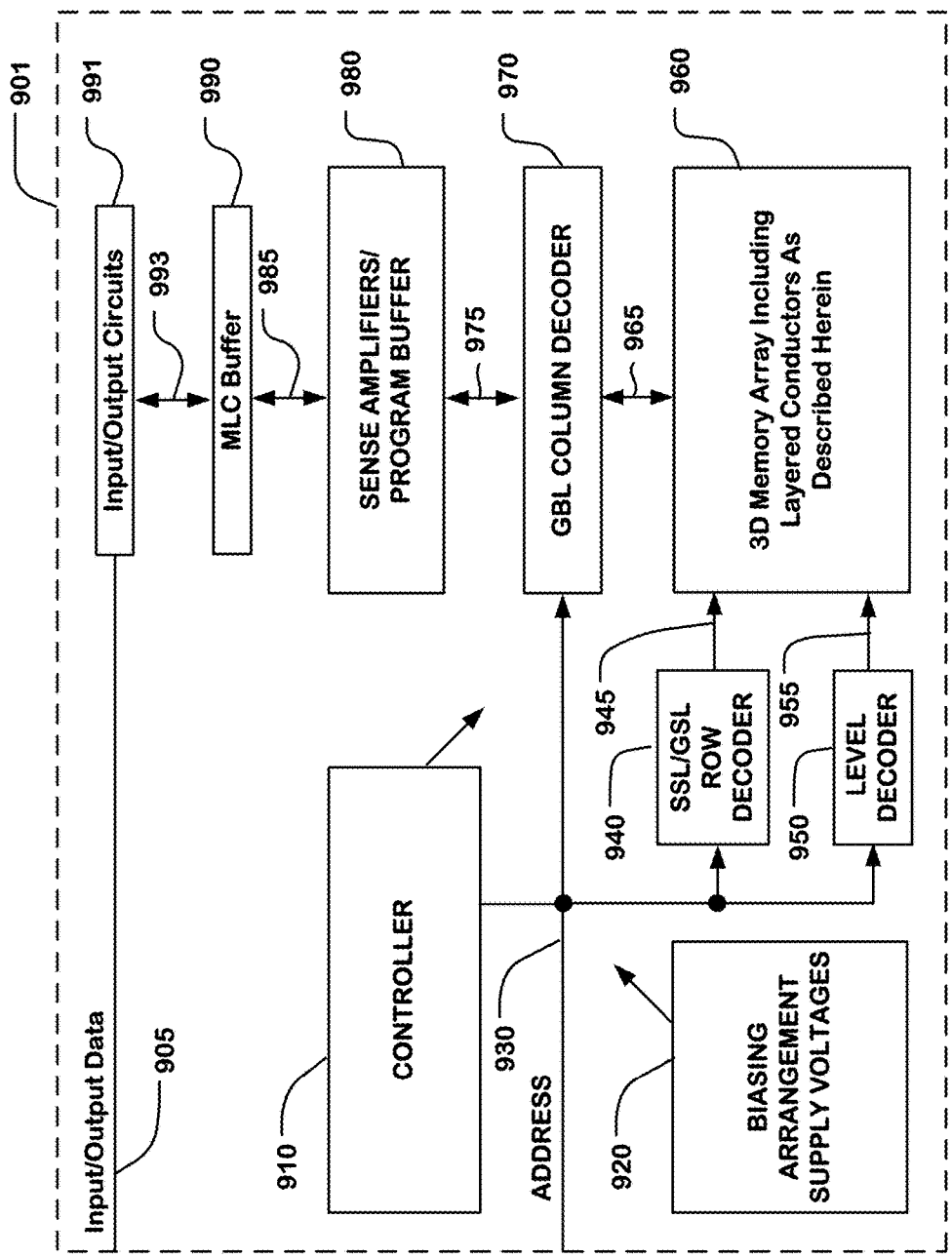
FIG. 16 is a block diagram of an integrated circuit memory including a 3D memory array having layered conductors as described herein.

FIG. 16 is a simplified chip block diagram of an integrated circuit 901 including a 3D, vertical thin-channel film NAND array. The integrated circuit 901 includes a memory array 960 including one or more memory blocks having the layered trench conductors as described herein.

An SSL/GSL decoder 940 is coupled to a plurality of SSL/GSL lines 945, arranged in the memory array 960. A level decoder 950 is coupled to a plurality of word lines 955. A global bit line column decoder 970 is coupled to a plurality of global bit lines 965, arranged along columns in the memory array 960 for reading data from and writing data to the memory array 960. Addresses are supplied on bus 930 from control logic 910 to column decoder 970, decoder 940 and decoder 950. Sense amplifier and program buffer circuits 980 are coupled to the column decoder 970, in this example via first data lines 975. The program buffer in circuits 980 can store program codes for multiple-level programming, or values that are a function of the program codes, to indicate program or inhibit states for selected bit lines. The column decoder 970 can include circuits for selectively applying program and inhibit voltages to bit lines in the memory in response to the data values in the program buffer.

Sensed data from the sense amplifier/program buffer circuits 980 are supplied via second data lines 985 to multi-level data buffer 990, which is in turn coupled to input/output circuits 991 via a data path 993. Also, input data is applied in this example to the multi-level data buffer 990 for use in support of multiple-level program operations.

Input/output circuits 991 drive the data to destinations external to the integrated circuit 901. Input/output data and control signals are moved via data bus 905 between the input/output circuits 991, the control logic 910 and input/output ports on the integrated circuit 901 or other data sources internal or external to the integrated circuit 901, such as a general purpose processor or special purpose application circuitry, or a combination of modules providing system-on-a-chip functionality supported by the memory array 960.

In the example shown in FIG. 16, control logic 910, using a bias arrangement state machine, controls the application of supply voltages generated or provided through the voltage supply or supplies in block 920, such as read, erase, verify and program bias voltages. The control logic 910 is coupled to the multi-level data buffer 990 and the memory array 960. The control logic 910 includes logic to control multiple-level program operations. In embodiments supporting the Gate-All-Around (GAA) NAND structures described herein, the logic is configured to perform the method of:

applying a reference voltage to common source lines, such as biasing the conductive layer on the substrate via the layered conductors described herein;

selecting a layer of memory cells in the array, such as using a word line layer decoder;

selecting vertical channel structures in a selected row in the array such as by using SSL switches and GSL switches on the rows of vertical channel structures; and storing charge in charge trapping sites in the selected layer on the selected row of vertical channel structures in the array, to represent data using bit line circuitry like page buffers on global bit lines coupled to the selected row of vertical channel structures.

In some embodiments, the logic is configured to select a layer, such as by controlling word line layer decoders.

In some embodiments, the logic is configured to store multiple levels of charge to represent more than one bit of data in the charge trapping sites in the selected layer on the selected row of vertical channel structures in the array. In this manner, a selected cell in the array stores more than two bits, including more than one bit on each cell.

The control logic 910 can be implemented using special-purpose logic circuitry as known in the art. In alternative embodiments, the control logic comprises a general-purpose processor, which can be implemented on the same integrated circuit, which executes a computer program to control the operations of the device. In yet other embodiments, a combination of special-purpose logic circuitry and a general-purpose processor can be utilized for implementation of the control logic.

The memory array 960 can comprise charge trapping memory cells configured to store multiple bits per cell, by the establishment of multiple program levels that correspond to amounts of charge stored, which in turn establish memory cell threshold voltages $V_T$. As mentioned above, single-bit-per-cell embodiments can include the structures described herein.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. An integrated circuit comprising:
a circuit structure having a top surface over a substrate;
a plurality of elongated trenches in the circuit structure, the elongated trenches in the plurality of elongated trenches extending from an upper layer of the circuit structure to the substrate beneath the circuit structure, and having sidewalls; and
a plurality of trench conductors filling corresponding elongated trenches in the plurality of elongated trenches, a trench conductor in the plurality of trench conductors including
a liner conductor conformal with sidewalls of the corresponding elongated trench, and in electrical contact with the substrate;
a first fill body filling a lower portion of the elongated trench between the sidewalls of the corresponding elongated trench over the liner conductor, the first fill body having an upper surface recessed from the top surface of the circuit structure; and
a top conductor body filling an upper portion of the elongated trench between the sidewalls of the corresponding elongated trench over the liner conductor, and in current flow communication with the liner conductor, wherein the liner conductor has a top surface disposed beneath a bottom surface of the top conductor body,
wherein the first fill body comprises a dielectric material.

2. The integrated circuit of claim 1, wherein the top conductor body includes a liner layer lining the upper portion of the corresponding elongated trench over the liner conductor, and a conductive fill.

3. The integrated circuit of claim 1, further comprising an insulating spacer layer on sides of the plurality of elongated trenches, insulating the liner conductor from elements of the circuit structure.

4. The integrated circuit of claim 3, wherein the elongated trenches in the plurality of elongated trenches have aspect ratios of 10 or more, and depths of at least one micron with continuous sidewalls.

5. The integrated circuit of claim 1, wherein the liner conductor has a thickness on the sidewalls of the corresponding elongated trench that in the lower portion adjacent the first fill body is on average less than a width of the first fill body.

6. The integrated circuit of claim 1, wherein the first fill body has stress characteristic effective to compensate for stress induced by the top conductor body on the circuit structure.

7. The integrated circuit of claim 1, wherein the circuit structure comprises a 3D memory structure; and the substrate includes a conductive layer in current flow communication with the plurality of trench conductors configured as a common source line, and one or more patterned conductor layers overlying a stack of active and inactive layers including connections to the plurality of trench conductors.

8. The integrated circuit of claim 1, wherein the liner conductor and top conductor body comprise different conductive materials.

9. A method of manufacturing an integrated circuit comprising:
forming a circuit structure over a substrate;
forming a plurality of elongated trenches in the circuit structure, the elongated trenches in the plurality of elongated trenches extending from an upper layer of the circuit structure to the substrate beneath the circuit structure, and having sidewalls;
depositing a liner conductor conformal with sidewalls of the elongated trenches, and in electrical contact with the substrate;
forming a fill body by filling lower portions of the elongated trenches between the sidewalls over the liner conductor, the fill body having an upper surface recessed from a top surface of the circuit structure; and depositing a top conductor body to fill upper portions of the elongated trenches between the sidewalls over the liner conductor, and in current flow communication with the liner conductor, wherein the liner conductor has a top surface disposed beneath a bottom surface of the top conductor body, wherein the fill body comprises a dielectric material.

10. The method of claim 9, wherein depositing the top conductor body includes forming a liner layer lining the upper portion of a corresponding elongated trench over the liner conductor, and depositing a conductive fill over the liner layer.

11. The method of claim 9, further comprising forming an insulating spacer layer on sides of the plurality of elongated trenches, insulating the liner conductor from elements of the circuit structure.

12. The method of claim 9, wherein the elongated trenches in the plurality of elongated trenches have aspect ratios of 10 or more, and depths of at least one micron with continuous sidewalls.

13. The method of claim 9, wherein the liner conductor has a thickness on the sidewalls of a corresponding elongated trench that in the lower portion adjacent the fill body is on average less than a width of the fill body.

14. The method of claim 9, wherein the fill body has stress characteristic effective to compensate for stress induced by the top conductor body on the circuit structure.

15. The method of claim 9, wherein the liner conductor and top conductor body comprise different conductive materials.

16. An integrated circuit comprising:
a plurality of trenches extending in a stack of active and inactive layers and into a conductive plate beneath the stack;
a plurality of layered conductors filling corresponding trenches in the plurality of trenches, each layered conductor including a liner conductor in electrical contact with the conductive plate and lining a portion of sidewall of a corresponding trench, an intermediate fill body over the liner conductor, and a top conductor body over the intermediate fill body and in current flow communication with the liner conductor, wherein the liner conductor has a top surface disposed beneath a bottom surface of the top conductor body; and
a plurality of pillars in the stack between a pair of the layered conductors in the plurality of layered conductors, and memory cells disposed at interface regions between the active layers and the pillars,
wherein the intermediate fill body has stress characteristic effective to compensate for stress induced by the top conductor body on the stack.

17. An integrated circuit comprising:
a circuit structure having a top surface over a substrate;
a plurality of elongated trenches in the circuit structure, the elongated trenches in the plurality of elongated trenches extending from an upper layer of the circuit structure to the substrate beneath the circuit structure, and having sidewalls; and
a plurality of trench conductors filling corresponding elongated trenches in the plurality of elongated trenches, a trench conductor in the plurality of trench conductors including
a liner conductor conformal with sidewalls of the corresponding elongated trench, and in electrical contact with the substrate;
a first fill body filling a lower portion of the elongated trench between the sidewalls of the corresponding elongated trench over the liner conductor, the first fill body having an upper surface recessed from the top surface of the circuit structure; and
a top conductor body filling an upper portion of the elongated trench between the sidewalls of the corresponding elongated trench over the liner conductor, and in current flow communication with the liner conductor,
wherein the first fill body comprises a dielectric material and the dielectric material comprises a compound including silicon and nitrogen.

* * * * *